(12) United States Patent
Iezzi et al.

(10) Patent No.: US 12,036,793 B2
(45) Date of Patent: Jul. 16, 2024

(54) ELECTROHYDRODYNAMIC JET PRINTED PHOTONIC DEVICES

(71) Applicant: The Regents of the University of Michigan, Ann Arbor, MI (US)

(72) Inventors: Brian Iezzi, Ann Arbor, MI (US); Max Shtein, Ann Arbor, MI (US); Zahra Afkhami Kheirabadi, Ann Arbor, MI (US); Kira Barton, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 0 days.

(21) Appl. No.: 18/209,942

(22) Filed: Jun. 14, 2023

(65) Prior Publication Data
US 2023/0321977 A1  Oct. 12, 2023

Related U.S. Application Data

(62) Division of application No. 17/396,043, filed on Aug. 6, 2021, now Pat. No. 11,712,889.

(60) Provisional application No. 63/062,389, filed on Aug. 6, 2020.

(51) Int. Cl.
*B41J 2/06* (2006.01)
*B41J 11/00* (2006.01)
*G03F 7/20* (2006.01)
*H01L 33/46* (2010.01)

(52) U.S. Cl.
CPC .......... *B41J 2/06* (2013.01); *B41J 11/00214* (2021.01); *G03F 7/2018* (2013.01); *H01L 33/46* (2013.01)

(58) Field of Classification Search
CPC ..... B41J 2/06; B41J 11/00214; G03F 7/2018; H01L 33/46; B82Y 40/00; B82Y 20/00; H10K 71/135; G02B 5/0841; G02B 1/005
See application file for complete search history.

(56) References Cited

FOREIGN PATENT DOCUMENTS

WO    WO-03098280 A2 * 11/2003 ....... B29D 11/00663

* cited by examiner

*Primary Examiner* — Bradley W Thies
(74) *Attorney, Agent, or Firm* — Lempia Summerfield Katz LLC

(57) ABSTRACT

A method of fabricating a thin film structure includes printing, using an electrohydrodynamic jet (e-jet) printing apparatus, a first layer comprising a first liquid ink, such that the first layer is supported by a substrate, curing the first layer; printing, using the e-jet printing apparatus, a second layer comprising a second liquid ink, such that the second layer is supported by the first layer, and curing the second layer.

11 Claims, 18 Drawing Sheets

ELECTROHYDRODYNAMIC JET PRINTED PHOTONIC DEVICES

CROSS-REFERENCES TO RELATED APPLICATIONS

This application is a divisional application of U.S. nonprovisional application entitled "Electrohydrodynamic Jet Printed Photonic Devices," filed Aug. 6, 2021, and assigned Ser. No. 17/396,043, which claimed the benefit of U.S. provisional application entitled "Electrohydrodynamic Jet Printed Photonic Devices," filed Aug. 6, 2020, and assigned Ser. No. 63/062,389, the entire disclosures of which are hereby expressly incorporated by reference.

STATEMENT REGARDING FEDERALLY SPONSORED RESEARCH OR DEVELOPMENT

This invention was made with government support under Contract No. 1727894 awarded by the National Science Foundation (NSF). The government has certain rights in the invention.

BACKGROUND OF THE DISCLOSURE

Field of the Disclosure

The disclosure relates generally to photonic devices.

Brief Description of Related Technology

One-dimensional photonic crystals (1DPCs) consist of alternating layers of high and low refractive index materials with an optical thickness on the order of the wavelength of the incident light. As optical filters or mirrors, the transmittance or reflectance of light by 1DPCs can be tuned by adjusting the sequence, thickness, and refractive index in the stack. 1DPCs have found wide ranging applications; from conventional lasers and optical filtering to novel mechanical and chemical sensing devices. 1DPCs have been fabricated by physical and chemical vapor deposition, solution processes such as spin or dip coating and thermal drawing. Polymeric 1DPCs have attracted attention recently due to their potential for simplified processing, as well as freedom to design chemically- and structurally-derived capabilities for new sensory applications.

Creating arrays of 1DPC elements (pixel filters) typically involves many costly lithographic steps. For instance, arrays of 1DPCs for imaging applications with pixel sizes of 30×30 µm were created with photolithographic masking processes, achieving a 2×2 array with each of the 4 pixels having a different optical response. Expanding to a larger multispectral or hyperspectral array with each element having a different response involves a corresponding increase in masking processes (e.g., 9 for a 3×3 array, 16 for a 4×4, etc.). Because a different optical response also involves a different thickness for each layer within each pixel, the number of deposition steps scales at the same rate.

Emerging additive manufacturing (AM) processes have been applied to the creation of photonic crystals with single and multiple materials at various length scales. At the mesoscale, fused deposition printing and a photonic crystal block copolymer were combined to produce 3D objects with structural color. Multiple photopolymers have been used with digital light projection (DLP) to create a single structure at the mesoscale. At smaller length scales of patterning, two-photon photopolymerization was used to realize air/polymer photonic crystals at the sub-µm length scale that achieved response in the visible regime after a post-print thermal shrinking procedure. While patterned arrays of photonic crystals have been demonstrated using inkjet printing, the need for solvent orthogonality and low viscosity inks have severely limited the structures obtained thus far.

SUMMARY OF THE DISCLOSURE

In accordance with one aspect of the disclosure, a method of fabricating a thin film structure includes printing, using an electrohydrodynamic jet (e-jet) printing apparatus, a first layer including a first liquid ink, such that the first layer is supported by a substrate, curing the first layer, printing, using the e-jet printing apparatus, a second layer including a second liquid ink, such that the second layer is supported by the first layer, and curing the second layer.

In accordance with another aspect of the disclosure, a device includes a substrate and a patterned stack supported by the substrate. The patterned stack includes a first layer supported by the substrate, the first layer including a first photopolymer and a second layer supported by the first layer, the second layer including a second photopolymer. The first and second photopolymers have different refractive indices.

In connection with any one of the aforementioned aspects, the devices and/or methods described herein may alternatively or additionally include or involve any combination of one or more of the following aspects or features. The method further includes filtering the first liquid ink in preparation for printing the first layer. The e-jet printing apparatus is operated in a drop-on-demand mode. The method further includes printing one or more pairs of layers including the first and second liquid inks such that the one or more pairs of layers are supported by the second layer. The method further includes forming a photodetector on the substrate such that the first layer is supported by the photodetector. Printing the first layer includes controlling a pulse width of the e-jet printing apparatus. Printing the first layer includes controlling a spacing of droplets deposited by the e-jet printing apparatus. Curing the first layer and curing the second layer are implemented while the substrate remains on the e-jet printing apparatus. Curing the first layer and curing the second layer include applying ultraviolet light. Curing the first layer is implemented in a nitrogen flow. The method further includes measuring reflectance of the first layer, using a microspectrometer integrated with the e-jet printing apparatus, before printing the second layer. The first and second liquid inks comprise first and second photopolymers, respectively. The patterned stack further includes further alternating patterned layers of the first and second photopolymers, the alternating patterned layers being supported by the second patterned layer. Each of the first and second patterned layers has a thickness less than about 200 nm. The patterned stack is configured as a one-dimensional photonic crystal. The patterned stack is configured as a Bragg reflector. The patterned stack is one of a pixelated array of patterned stacks supported by the substrate. The photonic device further includes a photodetector supported by the substrate. The photodetector is disposed between the patterned stack and the substrate. The substrate includes silicon. The first photopolymer has a higher refractive index than the second photopolymer.

BRIEF DESCRIPTION OF THE DRAWING FIGURES

For a more complete understanding of the disclosure, reference should be made to the following detailed description and accompanying drawing figures, in which like reference numerals identify like elements in the figures.

Figure 1:
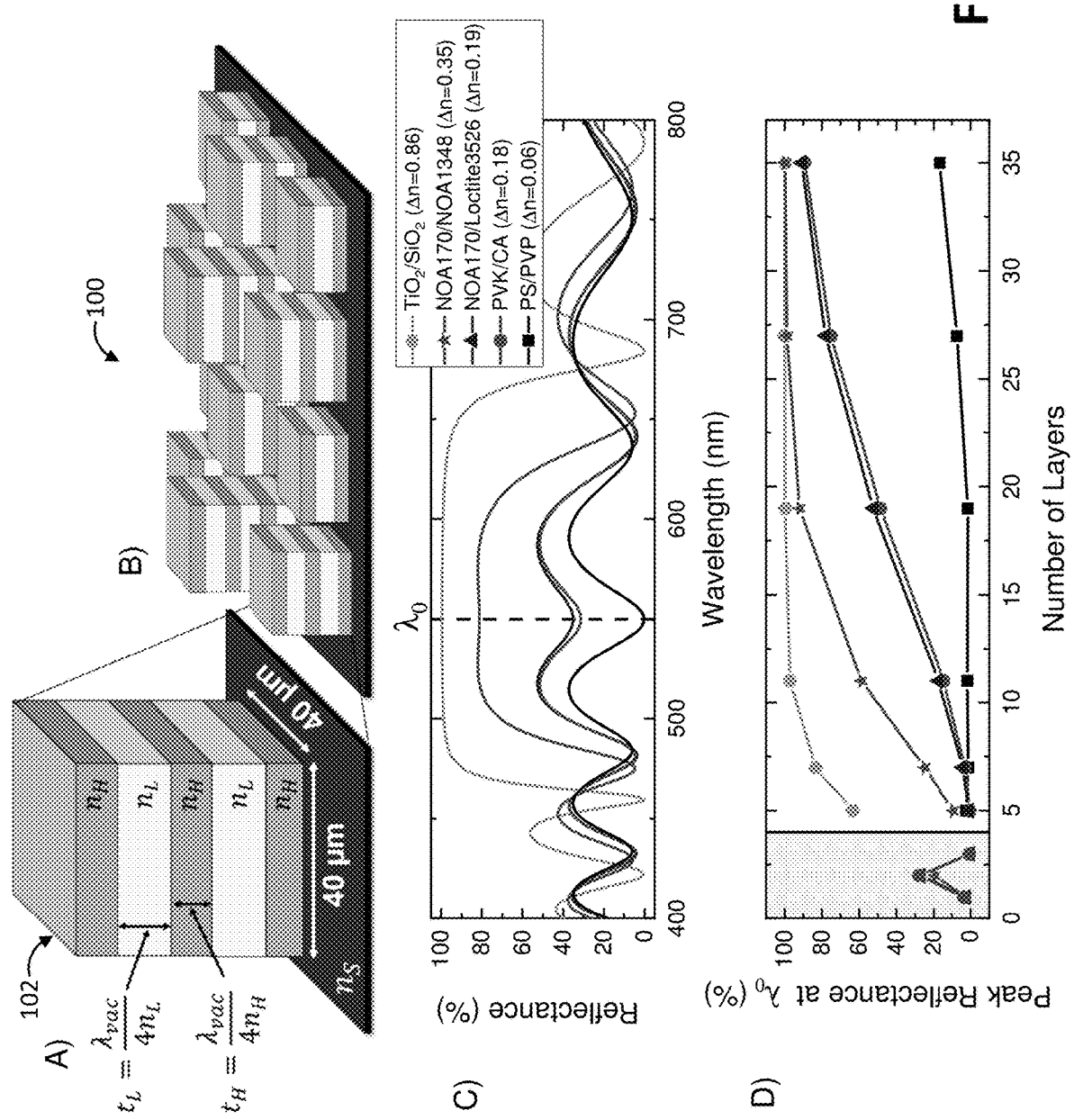
FIG. 1 depicts perspective, schematic views of photonic structures and devices, such as Bragg reflectors, in accordance with several examples, as well as graphical plots of reflectance and peak reflectance for a number of differing refractive index material combinations.

The embodiments of the disclosed systems, devices and methods may assume various forms. Specific embodiments are illustrated in the drawing and hereafter described with the understanding that the disclosure is intended to be illustrative. The disclosure is not intended to limit the invention to the specific embodiments described and illustrated herein.

DETAILED DESCRIPTION OF THE DISCLOSURE

One dimensional photonic crystal structures and photonic devices including such structures are described. Methods for fabricating such devices using electrohydrodynamic jet printing are also described. The disclosed methods use electrohydrodynamic jet (e-jet) printing to provide a mask-free, direct-deposition method that can achieve pixelated arrays of 1DPCs and other photonic devices. E-jet printing allows a wide variety of photopolymerizable inks and other polymer materials to be used. The photopolymerizable inks can be used in an additive manufacturing process to fabricate 1DPC and other photonic devices despite having a high viscosity (e.g., greater than 500 centipose, or cP).

E-jet printing is a high-resolution AM technique that operates by applying an electric field between a conductive nozzle and a grounded substrate to generate extremely high shear forces on the fluid without additional wall friction. The electric field, resulting shear forces, and lack of friction create micro-jets and enable droplets down to femtoliter volumes, resulting in spatial resolution in the sub-µm range, e.g., down to 100 nm.

Examples of e-jet process parameters are described for the creation of the multi-material, multi-layered structures. The optical properties of the materials are also quantified and the photonic response of the printed 1DPCs are determined and tied back to capabilities of the disclosed methods.

The configuration of the disclosed photonic devices may vary. In some cases, the one dimensional photonic crystal structures are incorporated into an imaging device. For instance, the disclosed photonic structures may be configured as a filter array of the imaging device, such as a Bayer RGB array. In some cases, the imaging device may be or include a hyperspectral imaging device in which the disclosed photonic structures are disposed adjacent photodetector sites configured to capture light across a broad or other desired spectrum, including, e.g., light outside of the visible spectrum. For instance, the photonic structures may be monolithically integrated on top of the photodetector sites.

The disclosed devices may be configured as filters in hyperspectral imaging and other detectors. As described herein, the disclosed devices may include periodic layers of alternating refractive index material. These layered stacks may be patterned in the plane of the detector according to a desired pixel layout. But instead of using typical microfabrication processes, requiring many masking and lithography steps, to create the layered stacks, the disclosed methods use e-jet printing to avoid the complexities and expenses of the lithographic process. The e-jet printing of the disclosed methods also allows non-conventional filter array geometries to be realized.

The disclosed methods use electrohydrodynamic jet printing to print microscale arrays of polymer material at the nanoscale thickness resolution used for optical interference, allowing for the realization of desired reflection and transmission properties. In some cases, a high-resolution jetting process is employed to generate localized, multi-layered structures, enabling the generation of arbitrary arrays of interference-based optical filters.

This disclosed devices may also include the combination of printed pixels, each pixel including a printed photonic crystal (e.g., a distributed Bragg reflector (DBR)-based mirror), and a photodetecting element. In some cases, the photodetecting elements, which may include organic and/or inorganic sensing layers, are monolithically integrated with the printed mirrors and filters. Because the light detecting elements may also be printed (e.g., by organic vapor jet printing, ink jet printing, contact transfer printing, etc.), the disclosed methods enable the realization of an all-printed hyperspectral imaging system. The organic nature of both the printed filter and photodetecting elements also enables deposition onto curved and flexible substrates. This in turn enables the realization of imaging systems with reduced image acuity loss at image edges and reduction in volume and weight of the system through simplification of the optical path (e.g., removal of image flattening optics).

Although described in connection with one dimensional photonic crystal structures and imaging and filtering devices including such structures, the disclosed methods and devices may be used to fabricate a wide variety of photonic and other devices, such as electronic devices. For example, the disclosed methods and devices may be used to realize complex patterns of optical (e.g. infrared) interference, and may thus be integrated into infrared beacons and other devices for generating patterns of infrared beacons on various surfaces. Still other types of photonic devices may be fabricated, including, for instance, diffraction gratings, multiple layer arrays, gradient refractive index structures, plasmonic reflectors and/or color filters, doped and undoped resonant cavities, scattering layers, absorptive filters, and others. The disclosed methods may be used to fabricate non-photonic devices, such as multi-layer, multi-material thin film transistors. Although described in connection with structures having stacks of alternating layers of two materials, the disclosed methods and devices are not limited to bilayer structures or alternating layer arrangements. Any number of materials may be deposited in the stacks or other structures.

FIG. 1 depicts a printed 1DPC device 100 in accordance with one example. The device 100 includes a number of 1DPC structures. Part A) of FIG. 1 is a schematic diagram of a 1DPC structure 102 of the device 100. The structure 102 includes alternating layers of high ($n_H$) and low ($n_L$) refractive index polymers with the physical thickness of each layer ($t_H$, $t_L$) determined by the center wavelength ($\lambda_0$) as well as the refractive index of the layer. Part B) depicts the manner in which the photonic device 100 includes an array of various layer pair 1DPC structures. The structures may be created via the e-jet printing process, examples of which are described herein. Part C) depicts the reflection comparison of a number of material combinations with the same number of alternating index layers (N=15) centered at $\lambda_0$=550 nm demonstrating the increase in stop band width as well as reflectance with increasing refractive index contrast. Simulations are conducted using a high refractive index ($n_s$=3.98) silicon substrate for more direct comparison to the printing process. Part D) depicts the peak reflectance achieved at the center wavelength ($\lambda_0$=550 nm) for an ideal 1DPC structure for an increasing number of layers. The shaded region simulates one, two, and three-layer stacks, but other arrangements may be included or deposited. For instance, in other cases, the structure or device may include one or more layers composed of, or otherwise including, a material, such as another photopolymer material, other than the two materials that form the alternating index layers.

In the filter array of FIG. 1, the refractive index contrast between the materials in the stack controls the width of the stop band. For instance, a low contrast allows for creation of narrow bands such as those used in notch filters, while a higher contrast may provide a broadband reflector. To minimize parasitic absorption and a resulting loss in reflection, the materials may be selected to have high transmission across a desired wavelength range.

Several trade-offs regarding ink composition may be navigated in balancing process and application considerations. Titania ($TiO_2$) and silica ($SiO_2$) sol-gels have previously been used in dip-coated photonic crystals that achieved significant refractive index contrast of $\Delta n$=0.86 ($n_{TiO2}$=2.34 and $n_{SiO2}$=1.48). Silica and titania-silica inks were also used in a direct-write AM process to produce optical quality glass components with varying refractive indices. In comparison, fluorinated polymers have refractive indices as low as n of about 1.3, while those with large aromatic rings or sulfur groups can have indices as high as n of about 1.7, yielding a contrast maximum of $\Delta n$=0.4. Refractive index contrast in polymeric 1DPCs ranged from $\Delta n$=0.07 for a polystyrene/polyvinylpyrrolidone (PS/PVP) combination to $\Delta n$=0.18 for a polyvinyl carbazole/cellulose acetate (PVK/CA) combination.

A variety of photopolymers and other liquid inks may be used in the disclosed methods and devices. Photopolymers are a mature class of materials with a wide range of commercially available compositions, with refractive indices ranging from, for instance, 1.315 (e.g., fluorinated acrylate polymers) to greater than 1.70 (e.g., zirconia/titania nanoparticle doped acrylates). In terms of refractive index contrast, the polymeric system examples discussed herein are significantly lower than the sol-gel systems, thereby involving more layers to achieve the same optical response. However, in the context of the e-jet printing fabrication methods, the ability to print multiple layers without having to remove the substrate is useful for both printing speed and reduction of errors due to re-registration when replacing the substrate. Although described in connection with photopolymers, the disclosed methods and devices are not limited to layers composed of photopolymers or other polymers. The layers may include additional or alternative materials, including, for instance, nanoparticle-based liquid inks and various inorganic materials.

The use of oxide sol-gels involves a multi-step curing process, including annealing at over 400° C., while the PS/PVP and PVK/CA polymer combinations both involve low temperature thermal cures around 100° C. In contrast, photopolymers typically require a sub-30 second exposure to UV light to solidify the film, thereby allowing multiple layers to be cured in-situ on the printing apparatus. The easier processability and relatively high refractive index contrast compared to benchmark polymeric systems make photopolymers useful candidates for use in a multi-layer, multi-material printed photonic crystal or other photonic device.

The following examples of photopolymers are addressed further herein: NOA170, a high index acrylate photopolymer doped with zirconia nanoparticles (average diameter 8-11 nm), Loctite 3526, a moderate index acrylate photopolymer, and NOA1348, a fluorinated low refractive index photopolymer. The industry-provided cured refractive indices of these three materials are: 1.70, 1.51, and 1.35, respectively. Other photopolymer materials may be used, including, for instance, various photopolymers doped with other metallic or dielectric nanoparticles, stimuli responsive photopolymers, and photopolymers composed of, or otherwise including, block copolymer base units including, for instance, azobenzene, epoxide groups, oxetane groups, thiol groups for attaching gold nanoparticles, and/or separate photo-initiator additive(s), such as Irgacure™, 1-Hydroxycyclohexylphenylketone, and similar compounds of different types (e.g., Norrish Type 1, Norrish Type 2), with response wavelengths tunable via composition.

The reflection spectra of a 15-layer photonic crystal are calculated for each material pair (Part C of FIG. 1) by solving the Fresnel equations using the transfer matrix method, illustrated at a convenient center visible wavelength, $\lambda_0$ 550 nm, of the 1DPC. Part D of FIG. 1 demonstrates the increase in peak reflectance with an increasing number of alternating index layers, showing that a higher contrast allows the use of fewer layers to achieve a given level of reflectance. The proposed photopolymer combinations achieve comparable or better reflectance response as those obtained in previously reported polymeric 1DPC systems. For instance, the photopolymer combination of NOA170-Loctite has very similar optical characteristics to the polyvinyl carbazole-cellulose acetate (PVK-CA) combination. The spin-coated PVK-CA system is thus used hereinbelow as a model system for comparison to the printed structures of the disclosed devices.

Figure 2:
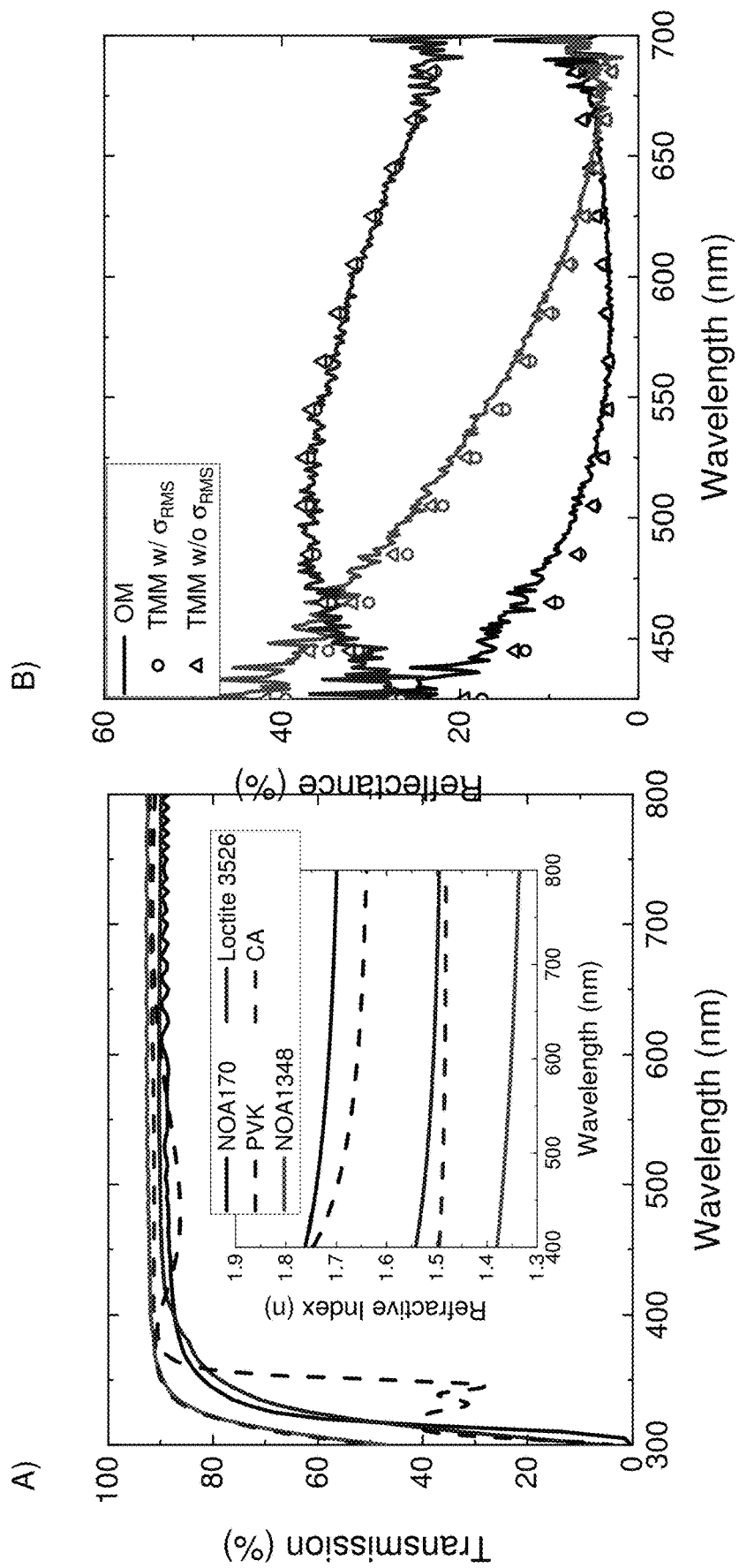
FIG. 2 depicts graphical plots of transmission and reflectance for a number of photopolymer materials for use in the disclosed photonic structures and devices.

FIG. 2 presents variable angle spectroscopic ellipsometry (VASE) and transmission spectroscopy to measure the refractive index and transmission across the visible to near infrared (400-800 nm) spectrum ranges of the photopolymers (NOA170, NOA1348, Loctite 3526) and the thermally-cured polymers (PVK and CA). The NOA materials are commercially provided with refractive index values of 1.70 for NOA170, 1.51 for Loctite 3526, and 1.348 for NOA1348 at the sodium D line (589 nm). Measured values at 589 nm were: n=1.72, 1.52, and 1.35 for NOA170, Loctite 3526, and NOA1348, respectively. The values of n=1.48 and 1.66 for CA and PVK, respectively, also agree well with literature. Note that for films that are 100 nm thick, any large particle could lead to a significant amount of surface roughness. Filtering was useful in connection with one of the inks addressed herein, Loctite 3526. For example, a 0.22 μm filter may be used to remove large oligomer entanglements or resin particles that can otherwise cause clogging of the small diameter nozzle prior to printing. A potential drawback to filtering the inks is that the refractive index or transmission properties may change as a result. For the Loctite, a slight drop in refractive index of 0.01 and an increase in transmission of 2% were observed. Overall, the measured refractive index contrast as well as high transmission across the visible to NIR spectrum (>80% for all materials tested) make these inks useful candidates for use in a printed photopolymer photonic crystal or other photonic device.

The disclosed methods are configured to produce a thin, uniform layer of polymer over a defined area. Once a polymer is deposited and cured, it then becomes the substrate for the next layer. Whether a polymer will deposit effectively, and ultimately merge to form a film, is determined in part by the surface energy of both the liquid polymer and the solid surface. In some cases, the first layer of a 1DPC or other photonic device is the higher refractive index material. Thus, the following cured-uncured polymer interactions are addressed herein: interaction between the high index photopolymer and the printing surface (e.g., silicon), interaction between the liquid lower index polymer on a cured higher index layer, and interaction between the liquid higher index polymer on a cured lower index layer. If these interactions are known, it is possible to predict which material combinations are likely to merge to a film using e-jet deposition. Higher order structures may thus be realized, including, for instance, stacks of three, five, seven, etc. layers. The results and discussion of solid surface energy and liquid surface tension at the macro and microscale are addressed below. In summary, the relatively low solid surface energy of the low refractive index materials (e.g., Loctite 3526 and NOA1348) coupled with the high liquid surface tension of the high refractive index material (e.g., NOA170) make it challenging to form a third layer (high index on low index). This is likely due to the low work of adhesion to the low surface energy polymer substrates as well as high work of cohesion of the NOA170 to itself, preventing the spreading of deposited ink. The low surface energy is likely due to the fluorinated groups used to decrease the effective refractive index of the low index photopolymer. The corresponding increase of film roughness due to partial merging, and its effect on the optical properties of the layers, is discussed further below.

A variety of different single and multi-layer photopolymer film structures may be fabricated via the disclosed methods. The e-jet printing of the disclosed methods may be used to print high resolution patterns of multiple materials by applying a high voltage (e.g., 200-1000 V but other voltages may be used) between a small diameter, conductive nozzle and a grounded substrate. This forms what is known as a Taylor cone of material at the nozzle orifice which, when pulsed with a varying voltage, ejects a drop which is smaller than the diameter of the nozzle.

There are several printing modes that are possible with the e-jet apparatus, including continuous cone-jet, multi-jet, and drop-on-demand. In drop-on-demand mode, the droplets are deposited at high frequency and then merge within milliseconds of contacting the surface to form first a line and then a film. Due to the extremely thin layers and high spatial resolution involved for creating the 1DPCs or other disclosed devices, drop-on-demand printing is useful for its droplet volume and placement precision. Other modes, such as the continuous cone-jet mode, may be used, but may deposit excess material in one location and thus small, thin layers would be limited by stage speed.

The spacing and sizing of the drops determines the resulting film thickness as well as surface roughness. In some cases, a 1 μm nozzle is used with drop-on-demand printing, but other nozzle sizes may be used. The droplets merge within milliseconds of contacting the surface to form first a line and then a film. Once an array of drops has been printed, the array is shuttled to a curing station where nitrogen gas is flowed over the surface and the surface is exposed to 365 nm UV light (e.g., via a UV lamp). The nitrogen gas is useful for full curing of NOA170 and 1348 as the photopolymerization reactions are oxygen-inhibited. In other cases, nitrogen-based curing is not used. For example, the Loctite 3526 photopolymerization is not oxygen inhibited. The curing technique(s) may vary in alternative or additional ways, including, for instance, use of a UV laser, curing under visible radiation, curing under near infrared radiation, and curing under near infrared radiation with the use of up-converting nanoparticles.

In some cases, the e-jet apparatus is outfitted with two nozzles, which provide several added benefits over a single nozzle system. Due to the bi-material composition of the 1DPCs, a dual nozzle system allows for efficient switching between material sources, reducing registration errors caused by switching nozzles. The dual nozzle configuration may also increase production throughput, which reduces evaporative clogging of the individual nozzles.

The droplet diameter may be used to achieve a desired film thickness. For instance, to achieve an approximately 100 nm thick film, the droplet diameter deposited may be between 1.0 and 2.5 µm, depending on the polymer being used. However, a wide variety of other diameters may be used.

NOA170 was first deposited as a single uniform layer and process parameters were adjusted to modulate thickness and, therefore, optical response as shown in Part B of FIG. 2. Three printed examples were measured with both atomic force microscopy (AFM) and optical microreflectance (OM), with the AFM-measured thicknesses of the three examples (78 nm, 105 nm, and 155 nm) obtained by modulating the spacing, or pitch, of the droplets. Further details are provided below. These thicknesses, along with wavelength-dependent refractive index data, were then used as inputs for the TMM simulation. Reflectance spectra collected from 15 µm spots in the center of the AFM-scanned area matched closely to the simulation, suggesting that OM can be used to accurately determine film thickness in situ and more conveniently and rapidly than AFM.

Two examples of bilayer structures were fabricated and tested. The examples involved a combination of NOA170 and NOA1348, and a combination of NOA170 and Loctite 3526. Uniform layers of each are obtained at low thicknesses (e.g., less than 200 nm for both). Optical simulations, taking into consideration the index of each of the layers, were used to compare the measured reflectance spectra and close matching for both material sets.

Figure 3:
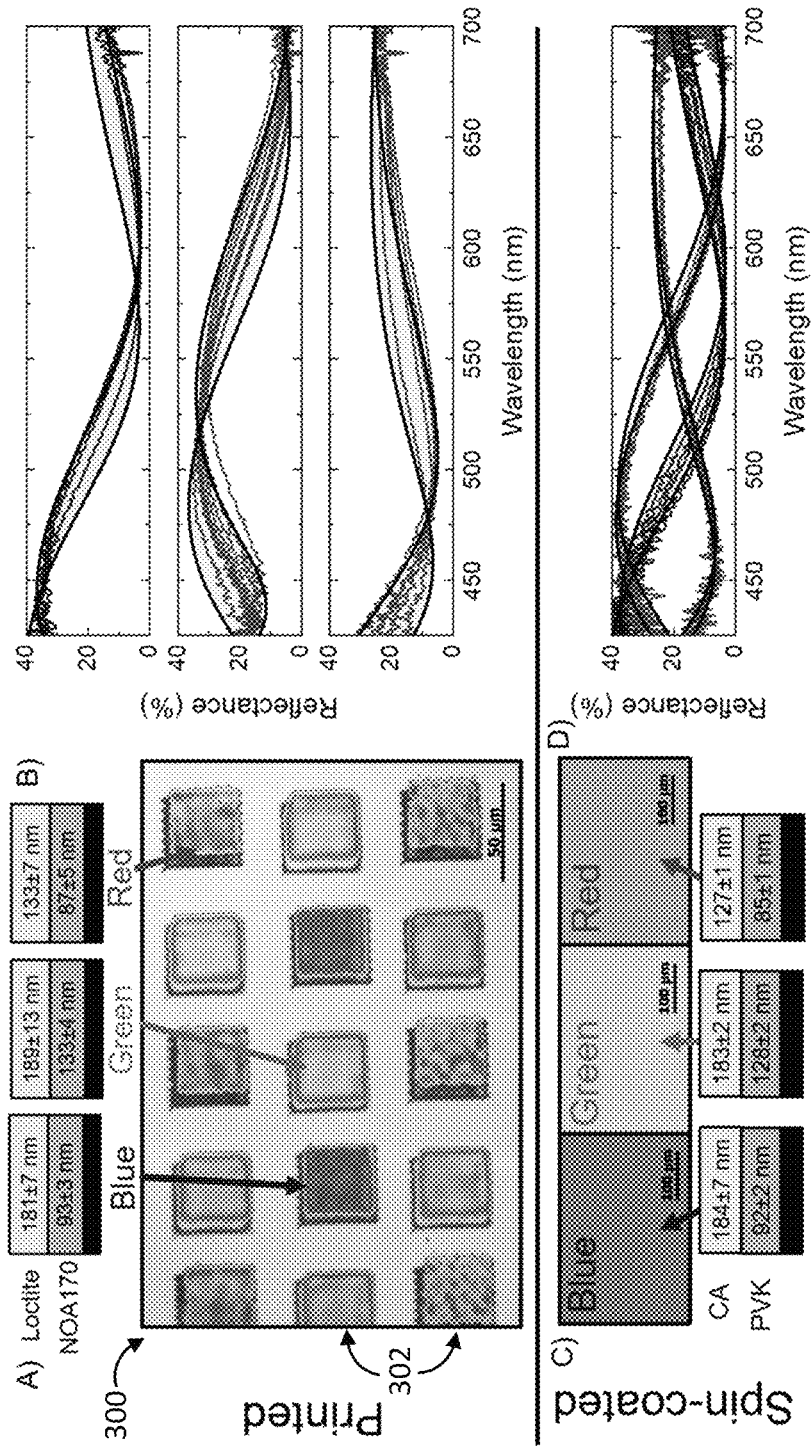
FIG. 3 depicts a photographic, plan view of a color filter array printed in accordance with one example, along with graphical plots of reflectance in comparison with spin-coated color filters.

FIG. 3 depicts an example of an all-printed Bayer filter array 300 having a bilayer configuration. In this example, bilayer structures 302 of the array 300 included layers composed of, or otherwise including, Loctite 3526. Other materials or material combinations may be used in the bilayer structures 302. While other combinations can be printed in a bilayer configuration, Loctite 3526 formed more uniform films than NOA1348, and was thus used as an example to demonstrate the ability to create the all-printed Bayer filter array 300 of FIG. 3.

In the printed Bayer filter bi-layer configuration shown in FIG. 3, an optical micrograph (50×) of the printed Bayer array composed of NOA170-Loctite 3526 dual layers demonstrated uniformity of pixel size (40 µm×40 µm) and color with blue, green, and red reflected light visible. Thicknesses of each layer along with standard deviations across all examples (e.g., a number of measured samples, N, being 4 to 9) for each color pixel are denoted in the graphic of FIG. 3 and in Table 1 below.

TABLE 1

Geometric and Optical Comparison between E-jet Printed (NOA170-Loctite 3526) and Spin-Coated (PVK-CA) examples in FIG. 3

|  | Layer 1 Thickness (nm) | Layer 1 $\sigma_{RMS}$ (nm) | Layer 2 Thickness (nm) | Layer 2 $\sigma_{RMS}$ (nm) | Peak Reflectance (%) | Peak Reflectance (nm) |
|---|---|---|---|---|---|---|
| E-jet Printed Layer 1: NOA170 Layer 2: Loctite |  |  |  |  |  |  |
| Blue (N = 4) | 92.7 ± 3.1 | 8.0 ± 0.4 | 180.9 ± 6.5 | 12.8 ± 1.5 | 37.9 ± 0.9 | 430.5 ± 4.0 |
| Green (N = 9) | 132.8 ± 3.6 | 8.8 ± 1.3 | 189.2 ± 12.5 | 17.8 ± 3.4 | 33.4 ± 1.2 | 514.1 ± 15.0 |
| Red (N = 5) | 86.7 ± 5.1 | 9.3 ± 1.1 | 132.5 ± 7.3 | 17.7 ± 4.6 | 25.1 ± 1.0 | 688.8 ± 6.5 |
| Spin-Coated Layer 1: PVK Layer 2: CA |  |  |  |  |  |  |
| Blue (N = 5) | 92.0 ± 1.5 | 5.5 ± 1.4 | 183.9 ± 6.9 | −0.6 ± 1.4 | 42.5 ± 0.7 | 436.2 ± 7.2 |
| Green (N = 5) | 128.2 ± 2.4 | −0.6 ± 2.6 | 183.1 ± 1.7 | 0.8 ± 1.6 | 40.2 ± 0.7 | 468.0 ± 11.2 |
| Red (N = 5) | 84.7 ± 1.1 | 9.7 ± 0.9 | 127.1 ± 1.4 | 0.1 ± 1.8 | 25.7 ± 0.1 | 675.6 ± 3.4 |

Part B of FIG. 3 depicts optical microspectroscopy results of all of Row 2 and Row 3 (9 examples each) matching visual determination of reflected colors in Part A of FIG. 3. Simulations (shaded region) based on high and low error (see plus/minus thickness variation in Part A of FIG. 3) in all three dual layers shows good bounding of all measured examples. The TMM simulations incorporate surface roughness as determined by AFM.

Part C of FIG. 3 shows an optical response comparison of printed NOA170-Loctite stacks with spin-coated PVK-CA dual layers (N=5). Due to the almost identical refractive index contrast, spin-coated stacks with similar thicknesses show similar optical response. Process variation (plus/minus thicknesses) and surface roughness (between 2-10 nm) for the spin-coated layers was lower and there was a resulting closer bound to the measured data. TMM data is shown via lines in Part D of FIG. 3.

In this example, the Bayer array 300 includes pixelated color filters, 50% of which are for filtering green light, and 25% of which are for red and blue light, respectively. To match the color response of these filters, it is possible to design for peak reflectance at certain parts of the spectrum by varying the thickness of the high and low index materials independently. The thicknesses of each layer gathered via AFM are summarized in Table 1 as well as average RMS roughness values. The close matching between the TMM simulation using the AFM-measured thicknesses and the optical reflectance is consistent over a relatively large sample size (N=18), demonstrating the repeatability of the manufacturing technique.

Figure 4:
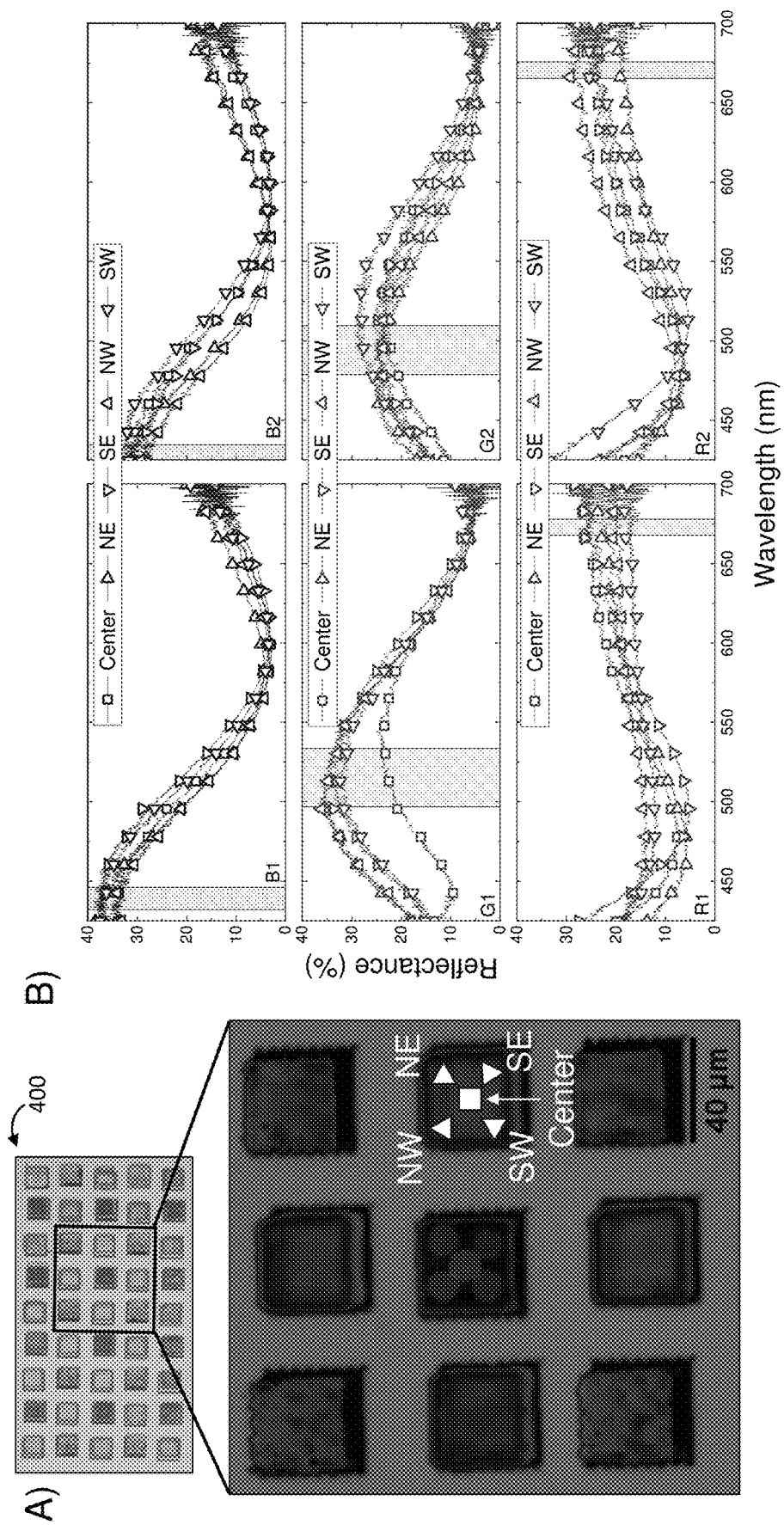
FIG. 4 depicts a photographic, plan view of a color filter array printed in accordance with one example, along with graphical plots of reflectance measured at various positions within each structure of the color filter array.

FIG. 4 shows spatial variation (or uniformity) of spectral response (e.g., pixel reflectance) across a single pixel. The OM system was utilized to take five samples, one in the center and four corners, of blue, green, and red pixels as indicated in the optical micrographs. In this case, the peak reflectance of the blue and red samples had low standard deviations in location not exceeding a 10 nm shift. There was a larger shift in the green samples, up to 18 nm, which is attributable to the higher degree of variation in thickness across these samples.

Part A of FIG. 4 shows an optical micrograph of a Bayer filter array 400 with a zoomed region indicating the locations across the area of a specific pixel that were measured using the OM system. Circles overlaid on the central sample show exact locations of data collection while the square/triangle symbols indicate the locations (Center, NW, SW, NE, SE) of corresponding information in the reflectance plots. Part B of FIG. 4 shows reflectance spectra of two samples each of blue, green, and red samples. Shaded regions indicate the standard deviation in peak reflectance location for each sample. The larger reflectance variation in the green samples can be attributed to larger thickness variations in Layer 2 (Loctite 3526) as compared to the red and blue samples.

To benchmark the printed samples, dual layers of spin-coated PVK-CA were designed and fabricated to have a similar optical response to the printed structures. These results are shown in Parts C and D of FIG. 3. Under the same illumination conditions, there is a qualitative match between the microscale printed samples and macroscale spin-coated samples. In addition, Table 1 provides a quantitative comparison in peak reflectance between the e-jet printed and spin-coated samples. Overall, there was an 11% decrease in peak reflectance in e-jet printed samples; attributed to the higher degree of surface roughness and resultant scattering loss. There was, however, a comparable standard deviation in peak reflectance position across all samples, driven by relatively low variation in thickness of 6.5 nm and 2.5 nm for printed and spin-coated samples, respectively.

The disclosed methods allow photonic or optical structures such as 1DPCs to be fabricated in accordance with precise specifications to achieve the desired photonic response. For example, the thickness of both the high and low index layers may be maintained in a repeating fashion throughout the entire multilayered structure to generate constructive interference. Stochastic modelling of 1DPCs showed that the uncertainty in thickness of both the high and low index layers remains within 10% of the design thickness (above or below) to maintain thickness tolerances for creating constructive interference at a desired wavelength. In the examples presented in Table 1, the maximum plus and minus thickness deviation for any printed layer was for the second layer in the green examples at 12.5 nm. For a 189 nm thick film, that is a 7% deviation in thickness, thus falling within the 10% functionality threshold.

The root mean square surface roughness ($\sigma_{RMS}$) at the interfaces of a 1DPC structure may also have an effect on reflectance response. For instance, for 1DPCs covering the visible and near infrared, the reflectance may remain constant for $\sigma_{RMS}$ values under 20 nm. Thus, for the disclosed methods and devices involving visible and near infrared 1DPC structures, a threshold of 20 nm may be set as an acceptable limit. Returning to Table 1, the maximum measured $\sigma_{RMS}$ was 17.7±4.6 nm, which, taking into consideration the standard deviation, is near the roughness limit set. This is also comparable to the PVK-CA system that exhibited a maximum $\sigma_{RMS}$ of 9.7±0.9 nm. It should be noted that the printed examples were created without integrated process control and thus thickness variation as well as surface roughness are expected to decrease with further control.

The disclosed methods may also be used to fabricate pixelated arrays of 1DPCs and/or other structures, as well as other photonic devices including such pixelated arrays. In high resolution imaging, for example, the size and sharpness (e.g., edge sharpness) of optical filtering elements is useful for achieving overall system capabilities. For instance, one ideal manufacturing process would be able to deposit layers composed of perfect rectangular prisms stacked on top of each other. Consider the "blue" patterns in FIGS. 3 and 4. The designed height for layers 1 and 2 were 90 nm and 180 nm, respectively. The designed in-plane dimensions were 40 μm by 40 μm.

A parameter such as the deposit shape factor, η, may be used to quantify the deviation between ideal and manufactured deposits, with a value of zero being a deposit without deviation from design specifications.

Figure 5:
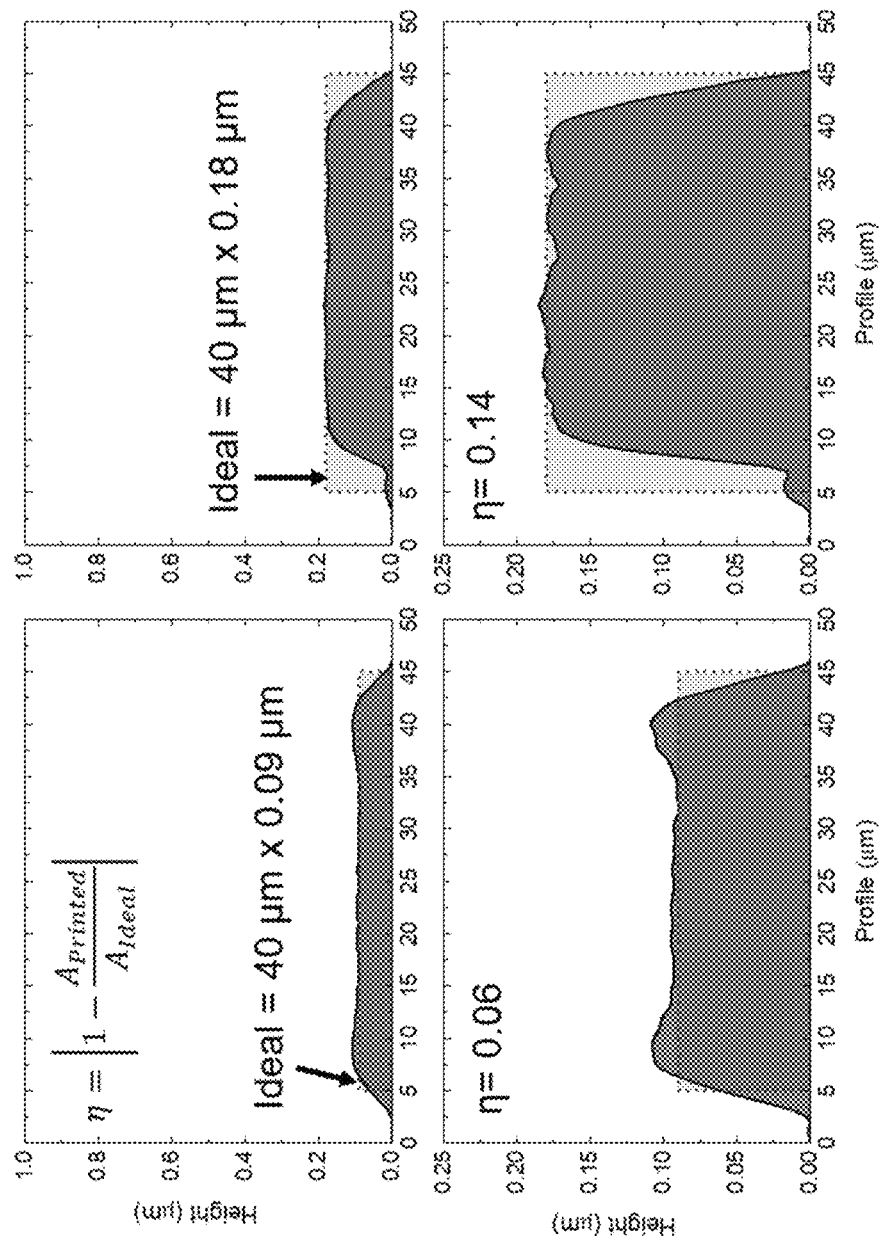
FIG. 5 depicts multiple graphical plots of profiles of layers printed in accordance with several examples.

FIG. 5 depicts the cross-sectional profile of the deposits for the first and second printed layers for the blue structure (e.g., NOA170/Loctite). The layers were measured by AFM and compared to the "ideal" structure via the deposit shape factor, defined as the ratio of the printed cross-sectional area to the ideal cross-sectional area. The upper plots show the low aspect ratio of the first layer. The lower plots show that the deposit shape factor for the second layer is farther from 0 than for the first layer.

In these examples, a deposit shape factor η=0.14 was found for the second layer, greater than the η=0.06 found for the first layer. The difference may be attributed to the challenge in depositing onto a relatively rough printed polymer surface. Furthermore, the tapering in the first layer led to a smaller printing area available for the second layer. Thus, spatial analysis of the printed pixels was also conducted to quantify the capabilities of the manufacturing technique. Deviations from designed ideal spatial values for the 40×40 μm² square pixels were 0.8%, whereas 13×13 μm² pixels exhibited deviations of 4.4%. The larger spreading of smaller pixels may be attributed to challenges in balancing thickness and spatial requirements. In both cases, the results suggest that the e-jet printing can achieve industrially relevant, patterned 1DPCs with acceptable error in thickness, surface roughness, pixel sharpness, and spatial area coverage.

In view of the surface studies addressed herein, one challenge in creating a layered structure for the disclosed methods and devices involves overcoming the lower solid surface energy of NOA1348 and Loctite as well as the high liquid surface tension of NOA170. In practice, it was found that the NOA170 ink would not merge into a film on top of NOA1348 but would partially merge into a thin film on Loctite. The higher liquid surface tension NOA170 ink may be more likely to cohere to itself versus adhere to a low solid surface energy surface like Loctite or NOA1348. The slightly higher solid surface energy of the filtered Loctite over NOA1348, 19.4 mN m$^{-1}$ and 11.5 mN m$^{-1}$, respectively, may also explain the preferential merging characteristics.

Figure 6:
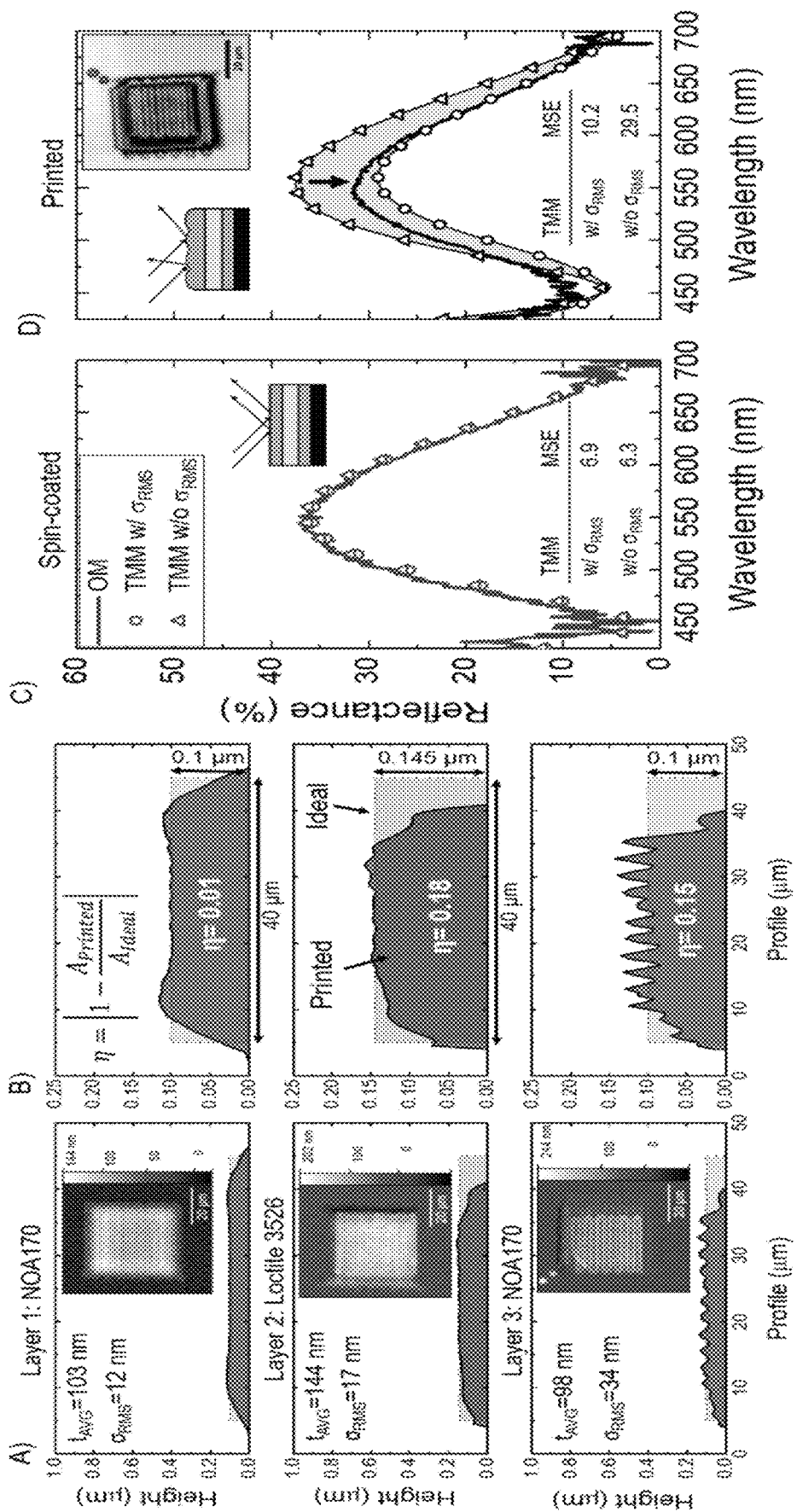
FIG. 6 depicts multiple graphical plots of profiles of layers printed in accordance with several examples, along with graphical plots of reflectance in comparison with structures formed via spin-coating.

FIG. 6 depicts a semi-uniform layer of NOA170 deposited on top of Loctite, as demonstrated by the relatively high roughness of the third layer ($\sigma_{RMS}$>30 nm). As evidenced by the measured spectra, the roughness can result in a significant reduction in the reflectance response due to light scattering. This is further confirmed by comparing the printed example to the response of a spin-coated sample of equal layer thickness. The surface roughness was below 10 nm for all three layers in the PVK-CA sample and thus there was low scattering loss. As these results indicate, it is possible to derive both thickness and roughness data from OM scans more rapidly than from AFM scans. While surface roughness is the likely cause of reflection loss in these samples, there are other potential sources of optical loss. Due to the multilayered and multi-material nature of the 1DPCs, there is also a potential for contraction of the photopolymers, particularly during the curing process. For example, multilayered, UV-cured acrylics have shown significant warping at the millimeter scale. Any variation in thickness due to warping could significantly affect the optical performance of the 1DPCs. However, there was no noticeable warping detected in the microscale printed multilayers, which may be attributed to length scale dependence of the behavior.

Once cured, the photopolymers investigated here are quite durable. Developed as adhesives, the shore durometer of the NOA170 and Loctite 3526 are 75 and 62, respectively. For a frame of reference, the shore durometer of a high-density polyethylene hard hat is approximately 75. To show the durability of the optical performance of these printed photopolymer 1DPCs, reflectance measurements were taken from several samples over one year after they were manufactured and only minor shifts in the spectra were observed.

Overall, the thicknesses of the layers being deposited (between about 60 to about 200 nm) are in the optimal range for near infrared (NIR) 1DPCs near the boundary of the visible regime. A 7-layer 1DPC with similar thicknesses as in FIG. 4 (tH=100 nm and tL=145 nm) would have a peak reflectance of around 35% at 780 nm (if the example were deposited on glass). Based on the transmission results gathered, these materials will still have good transparency at these longer wavelengths and thus these photonic crystals could find applicability in an array of NIR optical devices.

FIG. 6 depicts an example of a photonic device having a tri-layer, 1DPC configuration. In Part A of FIG. 6, AFM-generated cross-sections of printed NOA170/Loctite 3526/NOA170 tri-layer pixel with average layer thickness, surface roughness, and top view AFM inset. In Part B of FIG. 6, zoomed cross-sections of printed layers show an ideal thickness (100 nm/145 nm/100 nm) and base profile for each layer along with the deposit shape factor, η. A high degree of surface roughness can be seen in the third NOA170 layer. Part C of FIG. 6 depicts reflectance spectra and a transfer matrix simulation (TMM) of the three-layered sample of PVK/CA/PVK (102 nm/146 nm/100 nm) showing low MSE between the TMM and OM spectra due to low surface roughness (σRMS<10 nm) in all three layers. Part D of FIG. 6 depicts the reflectance spectra and TMM of NOA170/Loctite 3526/NOA170 with micrograph inset. Inclusion of roughness in TMM simulations results in a closer match to the optical spectra with mean-squared error (MSE) between the optical response and simulation with roughness being 10.2 versus 29.5 for the simulation without roughness. The drop in reflectance is attributed to scattering resulting from a high degree of surface roughness in the third printed layer.

Described herein are methods and devices that utilize photopolymeric materials with refractive indices near the boundaries of understood organic maximums as the constituent materials in one dimensional photonic crystals and other photonic devices. Criteria for selecting appropriate material pairs, based on a negotiation of optical and interfacial characteristics, were identified as well. Photopolymers with high refractive index contrast and good transmission were selected for ease of processing on the printing platform. As described below, interfacial materials selection criteria may be used such that drops of photopolymer ink are more likely to merge to uniform layers on high solid surface energy substrates (e.g., NOA170 and silicon), while the high liquid surface tension of NOA170 prevents good adhesion to low solid surface energy substrates such as NOA1348 and Loctite.

Electrohydrodynamic jet printing is used as a platform for depositing the photopolymers in precise three-dimensional space with micron-scale (μm) resolution in X and Y and nanometer resolution in Z. Examples of printed structures were fabricated with layer thicknesses from about 60 nm to about 200 nm, which allowed for modulation of light directly in the near infrared (700-1000 nm) and a significant portion of the visible spectrum (400-700 nm). Surface roughness, due to incomplete merging of a single layer, was high compared to other polymeric 1DPCs reported previously, yet still suitable for realizing dielectric mirrors and filters.

In some cases, the polymeric 1DPCs of the disclosed devices may be integrated or otherwise coupled with optoelectronic structures or devices. For example, a customized, all-printed array of 1DPCs for wavelength selection may be realized directly on a CMOS circuit, eschewing masks or solvents, thus addressing an issue with spatial and spectral resolution trade-off in the hyperspectral imaging community. Furthermore, and more in line with previous polymer-based 1DPC developments, the disclosed methods and devices may allow for a large number of customized optical sensors to be printed onto a single chip, finding applications in fields ranging from bioanalyte to gas sensing.

Various photopolymers may be used. In the examples described herein, the photopolymers were sourced from Norland Products (Cranbury, NJ) and Henkel Corporation (Düsseldorf, Germany). Norland Optical Adhesive 170 (NOA170) has a viscosity around 5,000 cP at 25° C. while NOA1348 has a viscosity around 1,600 cP at 25° C. Loctite 3526 has a manufacturer supplied viscosity of 17,500 cP at 25° C.

Additional or alternative photopolymers may be used. For example, the low (or lower) index layers of the disclosed devices may be composed of, or otherwise include, various fluorinated polymers. For example, fluorinated polymers, such as fluoroacrylates, fluoroepoxides, fluorooxetanes, fluorinated thiol-enes, and fluorinated vinyl ethers, may be used. The high (or higher) index layers of the disclosed devices may be composed of, or otherwise include, various polymers (e.g., base polymers such as acrylates, epoxides, and oxetanes) with monomers or oligomers containing functional groups, such as sulfur (e.g., linear thioether and sulfone, cyclic thiophene, thiadiazole and thianthrene), halogens (e.g., brominated or iodinated groups may be used to increase the refractive index), and phosphorous (e.g., phosphonates and phosphazenes) and/or high index nanoparticles, such as zirconia, titania (anatase and rutile), amorphous silicon, lead sulphide (PbS), and ZnS. The nanoparticle material(s) may be selected in accordance with the wavelengths of interest. For instance, bismuth telluride may be useful in connection with infrared wavelengths.

Printed samples may be cured on the e-jet printing setup. In some cases, the curing was implemented using a 365 nm UV LED lamp. Alternatively or additionally, the curing includes a nitrogen flow over the surface to prevent oxygen inhibition of the photopolymerization process.

One or more of the photopolymers may be filtered using a 0.2 μm filter prior to printing. Further details regarding the curing and other acts of the disclosed methods is provided below.

Figure 7:
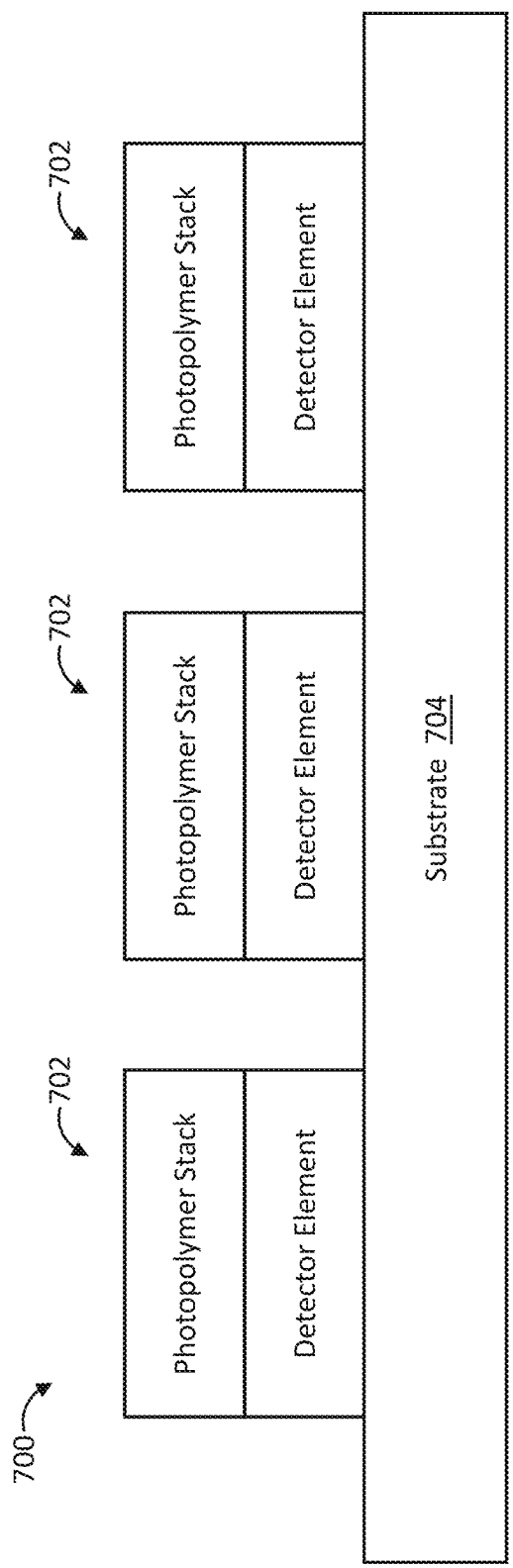
FIG. 7 is a schematic, side view of a photonic device having a number of stacks of photopolymer layers integrated with respective detector elements in accordance with one example.

FIG. 7 depicts a photonic device 700 having an array of pixels 702 supported by a substrate 704. Each pixel 702 includes a stack of photopolymer layers and a detector element in accordance with one example. The photonic device 700 may be configured as, or integrated with, a hyperspectral or other imaging device or system.

Figure 8:
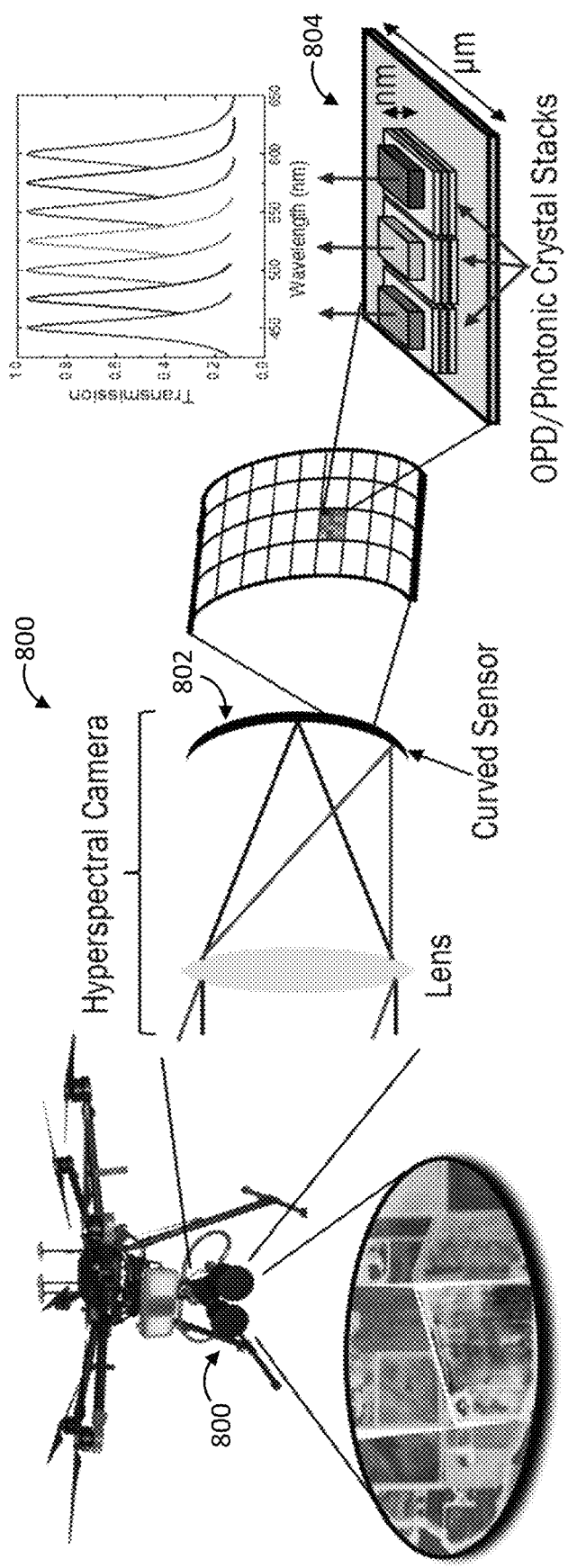
FIG. 8 depicts a hyperspectral camera having an array of photonic crystal structures supported by a curved substrate in accordance with one example.

FIG. 8 depicts an example application in which an autonomous aerial vehicle is equipped with a hyperspectral imaging system 800. In this example, the imaging system 800 includes a curved sensor or imaging device 802 for imaging over a wide field of view. The imaging device 802 includes a matrix or array of pixels 804. In this case, each pixel 804 has one or more organic photodetector/photonic crystal stacks. Each stack may be configured to capture a narrow band, contiguous spectral range for the entire image.

Figure 9:
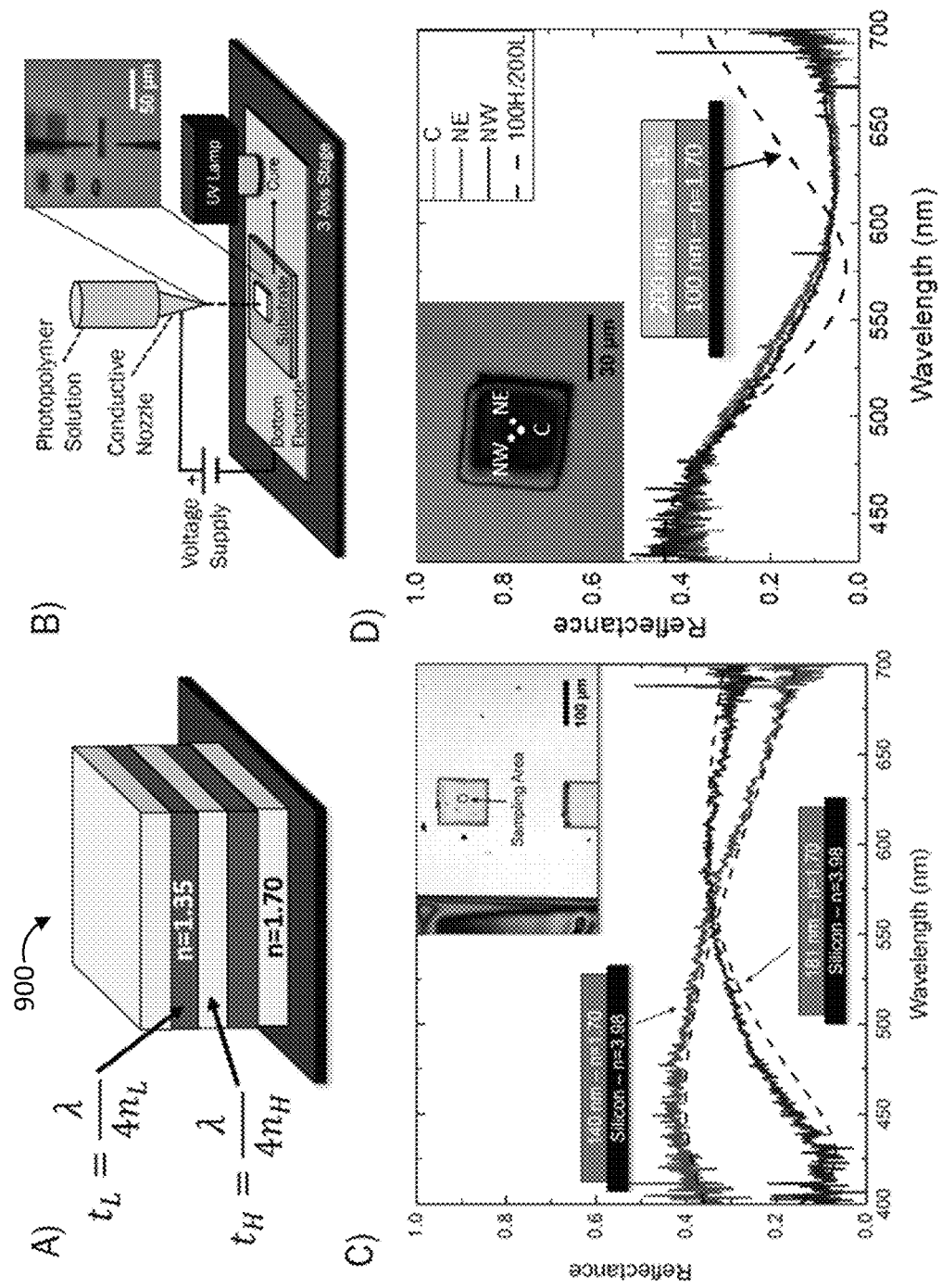
FIG. 9 depicts a photonic structure having a multi-material stack in accordance with one example, along with a schematic view of an e-jet printing apparatus for forming the stack and graphical plots of reflectance for the layers of the stack.

FIG. 9 depicts an example of a distributed Bragg reflector 900 with alternating layers of high (or higher) and low (or lower) index polymer materials. As shown in Part A, the layers are arranged in a stack with the high index layer adjacent a substrate supporting the layers. Part B of FIG. 9 depicts an example of an e-jet printing apparatus used to fabricate the stack. A live image inset is also shown. Part C of FIG. 9 is a graphical plot of spectral reflectance of differing thicknesses of a single layer of high index photopolymer. The dashed lines in the plot are indicative of transfer matrix simulations. An optical micrograph of the sampling area is shown in an inset. Part D of FIG. 9 is a graphical plot of reflectance of a two layer example including a high index photopolymer (n=1.70) and low index photopolymer (n=1.35) deposited sequentially.

Figure 10:
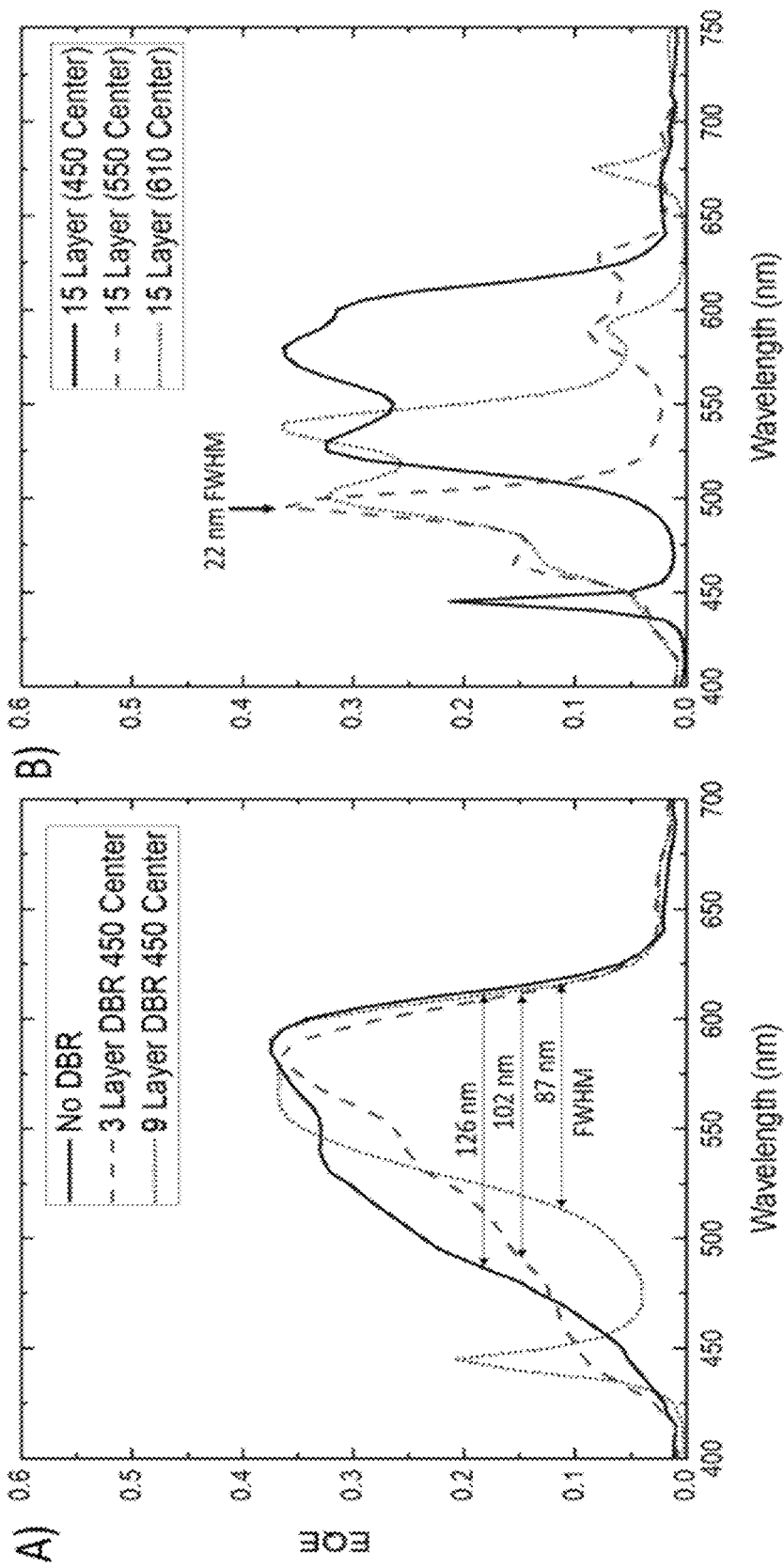
FIG. 10 depicts graphical plots of external quantum efficiency of a photonic device having a polymeric distributed Bragg reflector (DBR) integrated with a photodetector in accordance with one example.

FIG. 10 depicts the predicted external quantum efficiency of, in Part A, a polymeric distributed Bragg reflector (DBR) of varying layer pairs integrated with a photodetector (e.g., a SubPc/DMQA OPD), and in Part B, higher order DBRs with varying central reflection wavelengths integrated with the same photodetector. FIG. 10 shows the peak shifting capability of the disclosed structures.

The disclosed methods of electrohydrodynamic jet printing may be utilized to create multi-layer, multi-material constructs, e.g., with individual layer thicknesses between 80-200 nm, square pixels smaller than 40 μm across, and with surface roughness less than 20 nm, but other thicknesses, sixes, and other parameters may be achieved. The thickness and roughness specificity provided by the disclosed methods may accordingly meet the requirements of high precision optical interference structures while maintaining the ability to arbitrarily dictate spatial variation in optical response via a direct additive manufacturing method.

Figure 11:
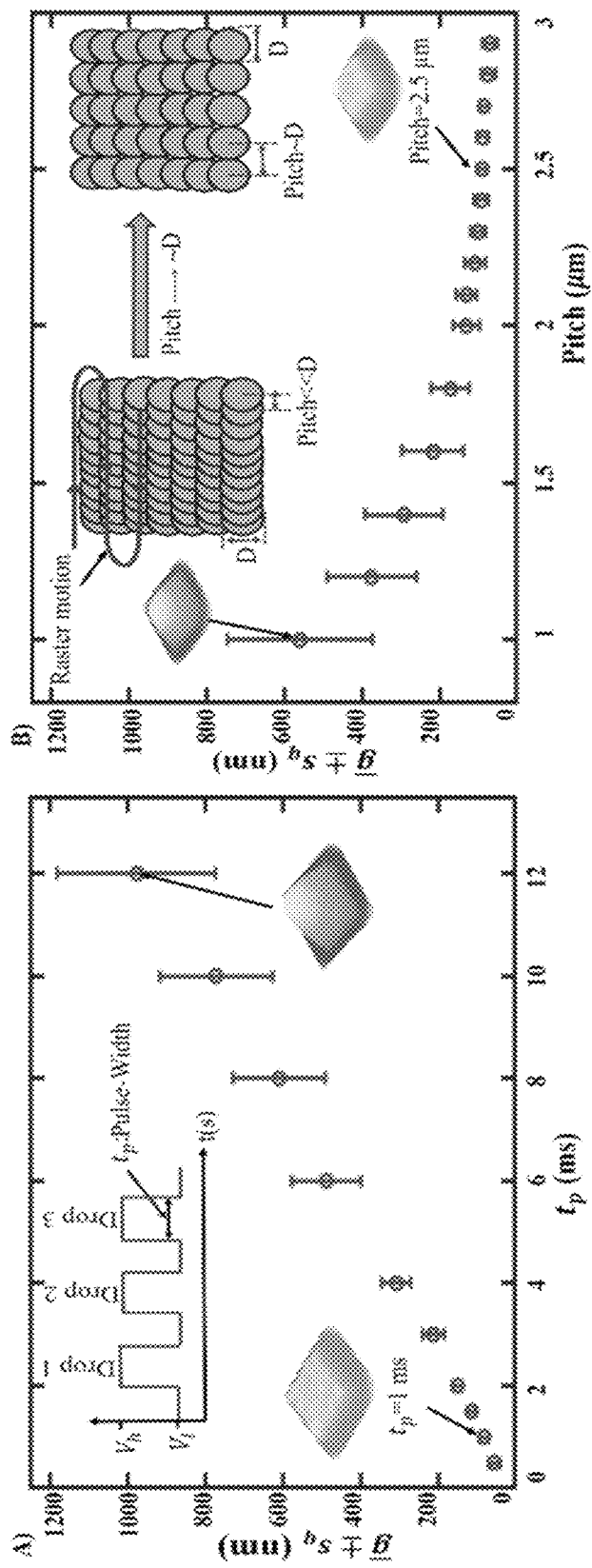
FIG. 11 depicts graphical plots of the average thickness resulting from implementation of the disclosed methods with varying pulse widths and pitches.

FIG. 11 details how the thickness and surface roughness of the resultant thin films are controlled in accordance with one example. As described further herein, the disclosed methods are capable of depositing multi-layered structures, each layer being composed of, or otherwise including, different refractive index polymers, to achieve control over the spatial optical interference via, e.g., microscale pixels.

A number of process parameters may be used to control the average thickness (g) and surface roughness ($s_q$) of the layers. In FIG. 11, error bars indicate root-mean-square (RMS) roughness for a number of examples as measured by an integrated AFM. The patterns (or layers) of the examples were printed on bare silicon wafers using an e-jet printer operated in drop-on-demand mode. In these cases, the drop-on-demand mode used a rastering motion. Other motions and modes may be used in other cases.

Examples of such process parameters include the pulse width ($t_p$) and pitch. In Part A of FIG. 11, the effect of pulse width ($t_p$) on pattern thickness and roughness is plotted for a fixed pitch of 2.4 μm. In Part B of FIG. 11, the effect of pitch on pattern thickness and roughness is plotted for a fixed pulse width of 1 ms. The average droplet diameter D was 2.8 μm. Convex patterns resulted from pitches much less than the average droplet diameter D. Uniform patterns resulted when the pitch was approximately equal, or similar, to the average droplet diameter D. Rough patterns resulted when the pitch was greater than the average droplet diameter D.

Figure 12:
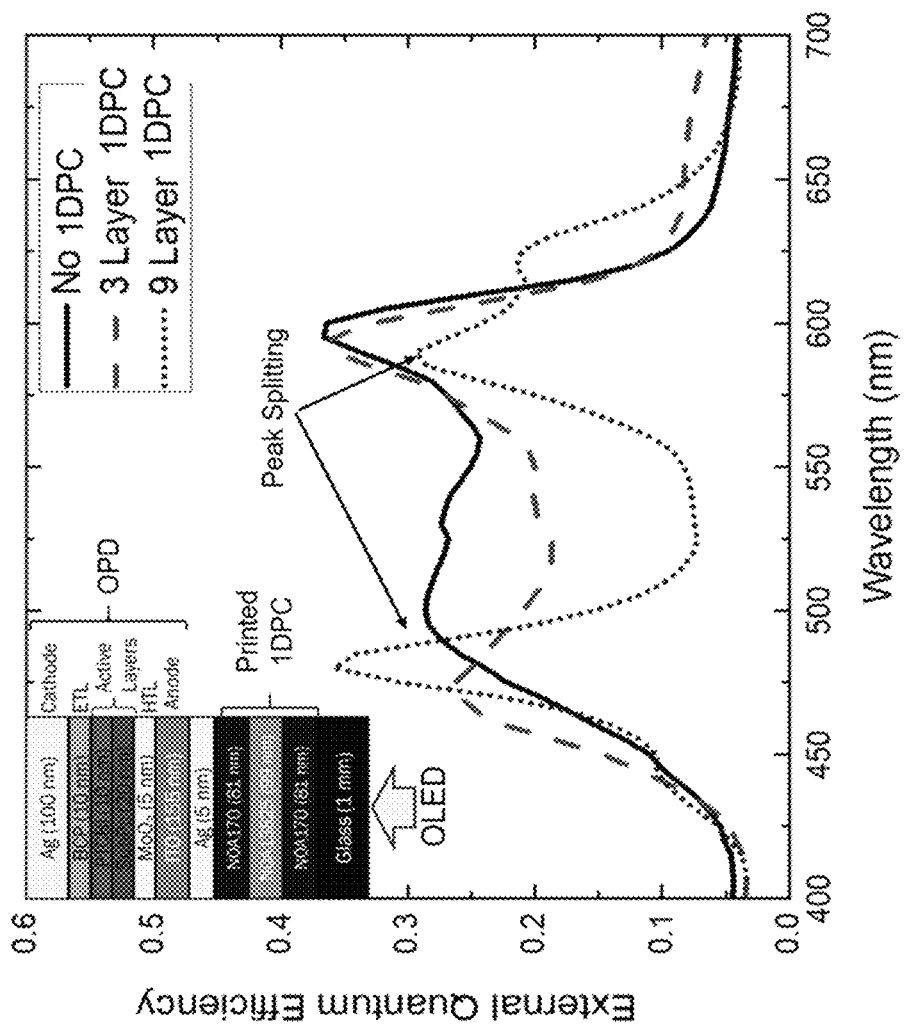
FIG. 12 depicts a graphical plot of external quantum efficiency of a photonic device in accordance with one example.

FIG. 12 presents the results of simulations that show that the coupled narrowband absorption of the organic photodetectors with the tunable optical modulation of the printed 1DPCs may achieve narrow detection peaks. Because implementations exist in which the light detecting elements are also printed (e.g. by organic vapor jet printing, ink jet printing, contact transfer printing, etc.), the disclosed methods and systems enable the realization of an all-printed system with multiplexed detection capabilities. The organic nature of both the printed filter and photodetecting elements also enables deposition onto curved and flexible substrates. This in turn enables the realization of imaging systems with reduced image acuity loss at image edges and reduction in volume and weight of the system through simplification of the optical path (e.g., removal of image flattening optics).

In the example of FIG. 12, a multilayered, printed 1DPC structure is first printed on a glass substrate, followed by deposition of an organic photodetector device. The photodetector device may include a bulk heterojunction (e.g., PTCBI/SubPc) active layer. The configuration of the stack is shown in an inset along with illumination from an external OLED to realize a fully integrated sensing device.

The example of FIG. 12 shows that multiple detection peaks may be created by placement of the stopband of the interference filter. Coupling of the narrowband OPD response with the tunable nature of the polymeric 1DPC allows for an integrated sensing device, which may be useful in a wide variety of biological or chemical applications.

The disclosed methods may be directed to fabricating vertically stacked, thin-film photonic devices using multiple materials (e.g., two or more materials). The disclosed methods use the additive manufacturing techniques of e-jet printing to enable material deposition on previously formed surfaces, by direct addition of material on existing topographies, without requiring cleanroom facilities and the use of masking steps more commonly used with lithography, and less material waste. The e-jet printing techniques are also capable of depositing high viscosity inks (e.g., greater than 50 cP) that are useful for certain applications, but cannot be printed using inkjet technology. Furthermore, the thermal or piezo-driven excitation used to deposit materials in a liquid phase in inkjet printing limits the achievable spatial resolution to larger than 20 µm.

E-jet printing is a solution-based fabrication technique enabling thin-film fabrication and patterning without the planarity restrictions of lithography and other subtractive processes. Compared to inkjet technology, e-jet printing has a much higher spatial resolution (0.05-30 µm), comparable to the resolution of lithographic processes, while also providing a high degree of freedom in creating customized patterns. Complex structures can be fabricated with high controllability and precision in desired locations from the micro- to nanoscale. E-jet printing is also capable of depositing a wide range of fluid viscosities, e.g., from 100-105 cP up to and beyond 50000 cP, several orders of magnitude larger than that of inkjet printing. This further enables flexibility in the classes of materials deposited, from biological materials to polymers and conductive inks. Manufacturing speed can also be increased by integrating multiple parallel printheads depositing multiple materials onto one platform.

Figure 13:
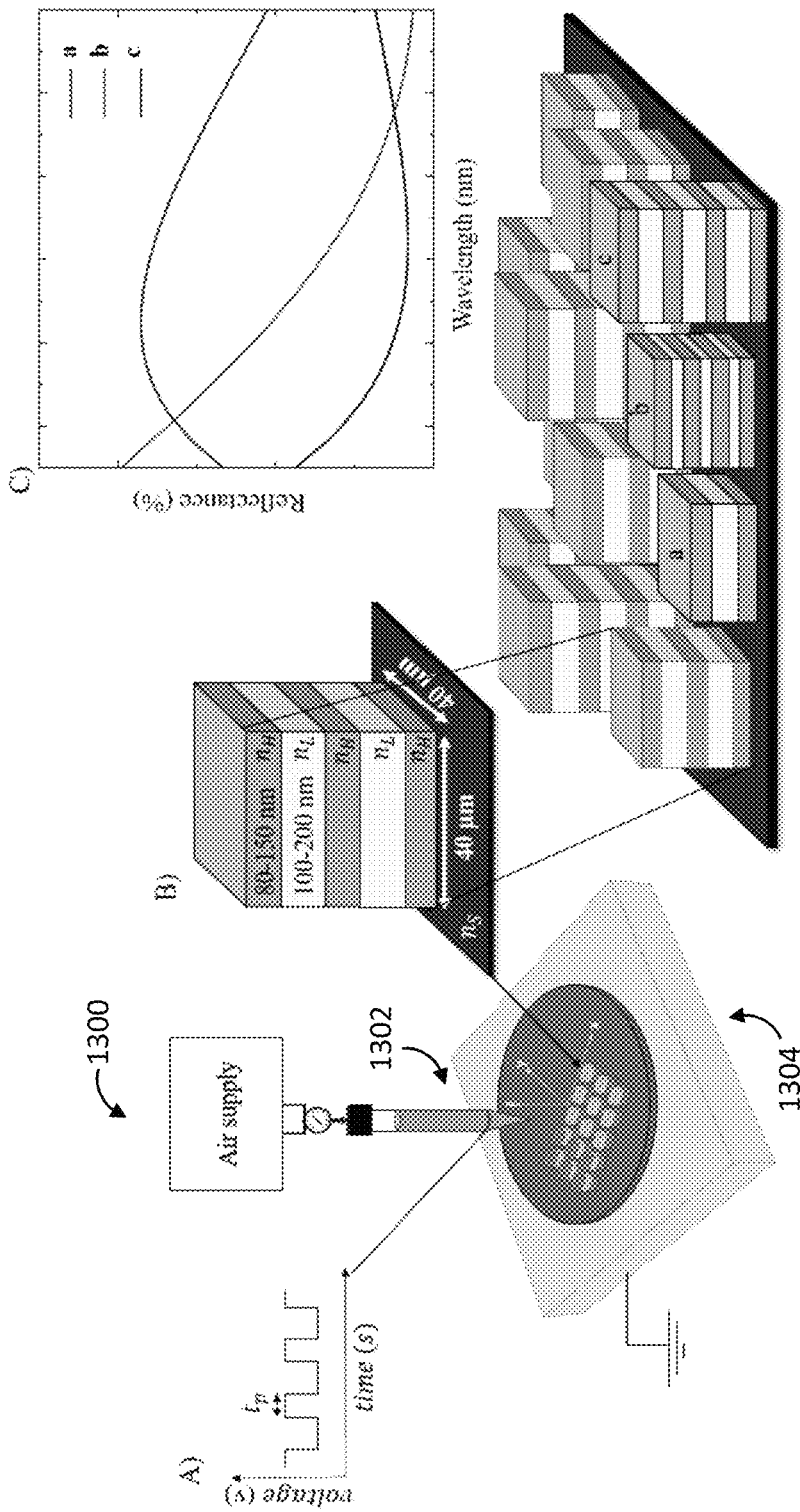
FIG. 13 depicts a schematic view of an e-jet printing apparatus and examples of a photonic structure and device fabricated thereby, along with a graphical plot of reflectance therefor.

FIG. 13 depicts an e-jet printer 1300 for use with the disclosed methods in accordance with one example. The e-jet printer 1300 may include a conductive nozzle 1302 holding the build material, a conductive substrate 1304, and a voltage amplifier. In one example of the e-jet printing process, a high voltage pulse is applied to the nozzle 1302 to eject a droplet of material with droplet volume related to pulse-width, $t_p$. The e-jet printer 1300 may include multiple (e.g., two) printheads. In operation, an electric field is created by applying a voltage difference between the nozzle tip and the grounded substrate 1304, changing the meniscus profile from a pendant shape to a cone shape, defined as a Taylor cone jet. As the field strength increases, electrostatic forces overcome ink capillary tension and the liquid build material jets from the tip of the cone to the substrate. The applied voltage can be pulsed with a pulse-width, $t_p$, from low voltage, $V_l$, to high voltages, $V_h$, as shown in Part A of FIG. 13. Custom structures may be fabricated by synchronizing the stage motion with the voltage pulses.

The disclosed methods may use an e-jet printer in a drop-on-demand printing mode. In that mode, the e-jet printer is capable of depositing sessile droplets at specified locations via, e.g., the above-referenced synchronization. Alternatively or additionally, a continuous jet-printing mode may be used to deposit material on the substrate. The continuous mode may be operated in a line printing manner. However, the continuous mode may not be as well suited for the fabrication of uniform thin films (e.g., film spatial resolution <100 µm×100 µm, film thickness <100 nm). The drop-on-demand mode may be more useful for the deposition of high-resolution droplets (e.g., droplet diameter <2 µm, droplet height <100 nm). In a continuous jet-printing mode, high-resolution droplets are generated by increasing the applied voltage, which simultaneously results in higher frequency jetting. High stage speed is then used to space out the printed material on the substrate to form sessile droplets rather than large conglomerations of printed droplets. As the stage speed increases, additional dynamics and noise may be introduced into the process, thus reducing the overall quality of the printed patterns. Thus, drop-on-demand printing offers more stability at a particular spatial resolution by controlling the release of a small volume of material at a desired coordinate and at a desired time.

Multi-material, layered structures with well-defined areas, smooth interfaces between layers, and controllable thicknesses may be fabricated using the disclosed methods. As described below, the disclosed methods provide a systematic technique to achieve these structures by e-jet printing.

The e-jet printing employs a complex ejection mechanism that is affected by the fluidic properties of the build material (e.g., surface tension, electrical conductivity, viscosity, density, etc.) and process parameters (e.g., nozzle size, nozzle electrical resistance, applied electric field, the surface energy of the substrate, etc.). The challenges that these and other aspects of the e-jet printing present for the printing process are addressed below. Material interactions at the micro and nanoscale are also addressed. Various combinations of process parameters and material properties are described in connection with the fabrication of multi-material, multi-layer structures with control of thickness at the nanoscale, and control of in-plane patterning at the microscale.

The deposition of individual droplets is described, along with how the droplets merge to form continuous layers. Those results are then applied to the fabrication of multiple stacked layers of different materials, enabling structures like vertical Bragg reflectors, examples of which are depicted in Part B of FIG. 13. The reflectance of a Bragg reflector can be tuned by the number of layers and corresponding thicknesses, as shown in Part C of FIG. 13, given a set refractive index material pair. Several process parameters that determine the quality of film formation are then addressed, which in turn influences device functionality. The material properties and their scale-dependence that contribute to high-quality film formation are also addressed.

A number of materials are compatible with the disclosed methods, in the sense that the materials demonstrate stable jetting behavior during deposition as well as merging characteristics after the material has reached the substrate. Stable jetting behavior may describe materials that form a stable, single Taylor cone jet at the meniscus without clogging or evaporating. Good merging characteristics may describe build materials that spread to a uniform thin-film on existing topography. These characteristics may be useful in connection with the fabrication of a photonic crystal or other photonic structure or device using e-jet printing, e.g., with alternating layers of low and high refractive indices of commercially available photopolymers. Examples of material combinations with favorable optical properties for the fabrication of a multi-material, multi-layer photonic crystal are also presented below. The photonic responses of the example structures are also quantified below.

Thin-film fabrication using the drop-on-demand e-jet printing of the disclosed methods includes or involves droplet ejection, droplet spreading, and droplet coalescence. Materials with stable jetting behavior will form a single stable Taylor cone jet at the meniscus. After the material is ejected from the nozzle tip, a sessile droplet is formed on the substrate (or other layer) with a spherical cap shape that is defined based on the droplet diameter and contact angle. The droplet geometry depends on the electric field, the kinetic energy imparted on the droplet at ejection, the surface tension of the droplet, surface energy of the substrate, rheological properties of the ink, and the viscous energy lost during spreading. UV-curable photopolymer inks may be deposited in this manner onto conductive, smooth silicon wafers. The inks may be selected for their combination of fluid properties as well as having the ability to be cured in situ, without requiring high temperature operations. As an example, NOA170 may be used in some cases to form thin-films on a polished silicon substrate.

The controllable process parameters that can affect the applied electric field, and subsequent droplet volume, include: high voltage value, low voltage value, pulse width ($t_p$), nozzle size, and standoff height (distance between the nozzle tip and the substrate). The droplet volume of a specific material may be adjusted using the pulse width $t_p$, while keeping all other process parameters constant. The pulse width $t_p$ may be used in this manner because the pulse width has a direct mapping to droplet volume, and reduces the introduction of additional jetting dynamics and disturbances, such as nozzle arcing, which are more likely to occur with changes in other process parameters like high voltage or standoff height. Each droplet may be a result of a single droplet released within the designated pulse width $t_p$. Successive droplets may be placed at a certain distance (center to center) from each other, defined as pitch, to form a film. The average thickness of a film, g, and the root mean square (RMS) surface roughness, $s_q$, may be defined as:

$$\bar{g} = \frac{1}{N_1 \times N_2} \sum_{i=1}^{N_1} \sum_{j=1}^{N_2} g_{i,j}$$

$$s_q = \frac{1}{N_1 \times N_2} \sqrt{\sum_{i=1}^{N_1} \sum_{j=1}^{N_2} (\bar{g} - g_{i,j})^2}$$

where $g_{i,j}$ is the topography of the pattern at the discretized coordinate of (i,j), and $N_1$ and $N_2$ are the total number of discretized coordinates in the X and Y direction. Note that both g and $s_q$ are measured using an integrated AFM.

Roughness is a representation of the merging quality of a film such that a low $s_q$ value indicates a smoother film. The thickness and roughness of the printed films may be regulated by adjusting the droplet volume and pitch. As such, pitch and $t_p$ are independent variables while film thickness and roughness are dependent variables. At small $t_p$ or large pitch values (pitch much greater than D), the droplets become smaller than the pitch, which yields voids in the pattern and increases the film's roughness. To quantify film quality, a thin-film pattern with a thickness smaller than 200 nm is considered to be fully merged if it has an $s_q$ value less than 20 nm, partially merged for $s_q$ values between 20 nm and 50 nm, and unmerged for $s_q$ values greater than 50 nm.

Several examples of these interactions were tested at the microscale. Loctite3526 fully merges on NOA170 with thickness and RMS roughness of 90 nm and 6 nm, respectively. NOA170 partially merges on NOA144 with thickness and RMS roughness 175 nm and 40 nm, respectively. NOA170 does not merge on NOA1348 with thickness and RMS roughness 250 nm and 200 nm, respectively.

With reference again to FIG. 11, Part A shows the effect of pulse width $t_p$ on the average thickness and corresponding RMS surface roughness (represented as error bars) of NOA170 films (e.g., 60 µm×60 µm). In this example, the controlled process parameters include: $V_h$=500 V, $V_l$=250 V, nozzle size=1 µm, standoff height=20 µm, and pitch=2.4 µm. The pulse width, $t_p$, may be varied. In this example, the pulse width fell in a range from about 0.5 ms to about 12 ms. The range may be used to investigate its effect on film quality. Note that the diameter of a droplet is varied by changing $t_p$. It is observed that decreasing $t_p$ from 12 ms to 2 ms decreases the pattern thickness and roughness. A pulse width of 1 ms ($t_p$=1 ms) resulted in the lowest roughness ($s_q$=7.23 nm) with a film thickness of 95 nm. Other pulse widths may be used.

Part B of FIG. 11 shows the influence of pitch on average thickness and roughness of NOA170 films. In this example, a raster type motion is used to print a continuous line that merges to form films, as presented in the inset of Part B. The controlled process parameters are the same as those used to evaluate the effect of pulse width; however, pulse width $t_p$ is set to 1 ms, which yields an average droplet diameter of D=2.83±0.12 µm. The pitch was varied in a range of 1-2.9 µm. As the pitch increases, both the roughness and thickness decrease. In this case, pitch of 2.5 µm resulted in the lowest roughness ($s_q$=8.41 nm) with an average thickness of 89.63 nm. Other pitches may be used.

The above-described examples show that the e-jet printing process of the disclosed methods may be customized via at least two parameter selection steps. The process may include (1) ejecting controlled droplets by pulsing from low to high voltage over a designed time period (a shorter pulse width $t_p$ leads to smaller droplets), and (2) adjusting the pitch between deposited droplets to achieve thin, uniform patterns. In some cases, the pitch values may equal or otherwise correspond with (e.g., be similar to) the droplet diameter D.

The process parameters may be selected to achieve the deposition of smooth, nanoscale films onto a uniform surface (e.g. polished silicon). However, in some cases, tuning the process parameters does not guarantee a fully merged film. It is possible for a build material to merge into a uniform film on one material, but not on a different material. This raises the question of how to determine appropriate material interactions in multi-material structures that are fabricated in a layer-by-layer fashion. For example, to create a multi-material structure such as a photonic crystal, a refractive index contrast ($\Delta n=n_H-n_L$) is established between neighboring layers, which introduces variations in surface energy for each additional layer being deposited. To quantify the impact of these variations, examples of the shape of sessile droplets of a build material on a previous surface were tested. A number of photopolymers were tested: NOA170, Loctite3526, NOA144, NOA142, NOA13825, NOA138, NOA13775, NOA1369, and NOA1348, with refractive indices ranging from n=1.35 to 1.71, which provides an index contrast maximum of $\Delta n$=0.35. In one example, NOA170 was the $n_H$ material due to its high refractive index of 1.70. A suitable low refractive index material ($n_L$) may then be found to fabricate a multi-layer structure such as those described herein. The substrate (e.g., a silicon wafer) may be referred to as the primary substrate, while previously deposited, fully merged and cured photopolymer surfaces may be referred to as a secondary support layer.

Figure 14:
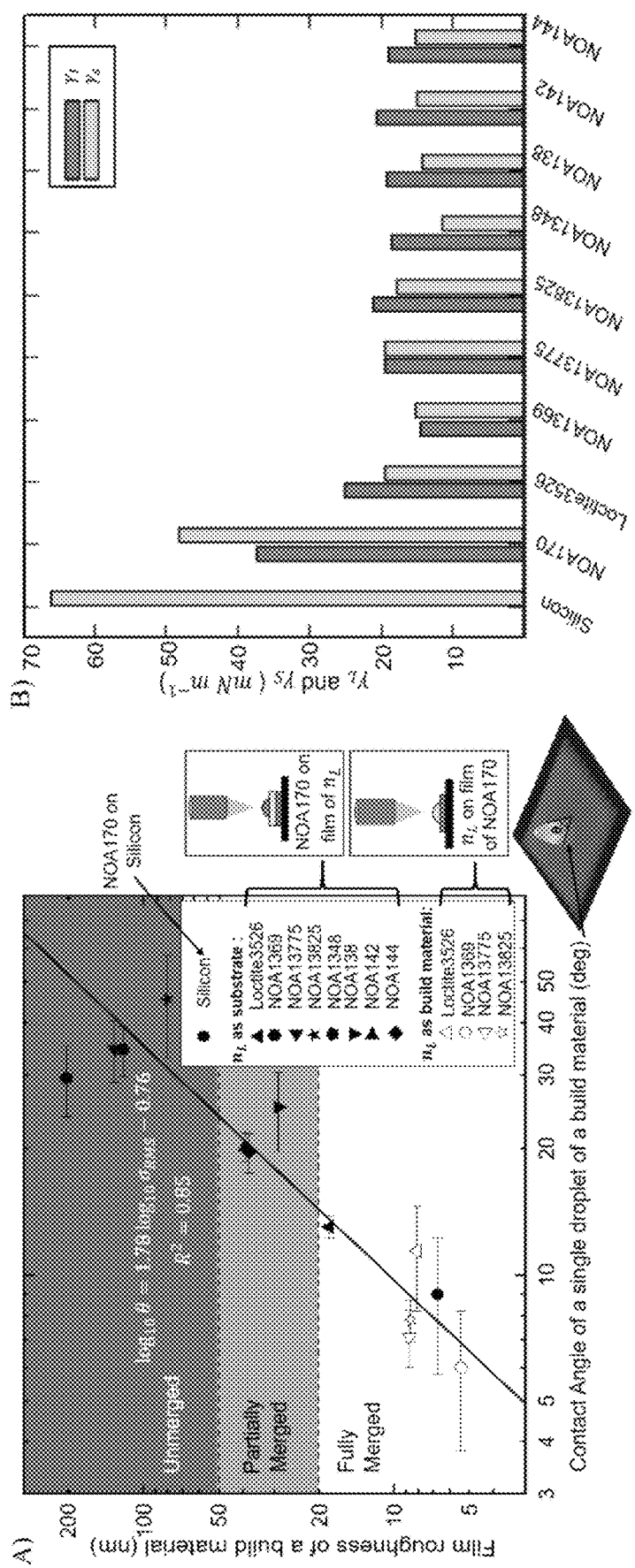
FIG. 14 depicts graphical plots relating to a contact angle parameter of the disclosed methods.

The substrate/support layer-ink interaction may be defined or otherwise established by the contact angle, which is a function of fluidic properties of the build material (Liquid surface tension (LST), viscosity, evaporation rate, density, etc.), and surface energy of the previous (substrate or supporting) layer. The solid surface energy (SSE) of a substrate may affect droplet shape and subsequent feature resolution in high-resolution e-jet printing, where the microscale contact angles of droplets may be used to predict the merging quality of lines on varying SSE surfaces. Microscale contact angles (e.g., droplets of 2-10 µm) may also be used to predict or establish the roughness of a deposited layer of a build material on the surface of a previously printed material. Microscale contact angles have been shown to differ from macroscale contact angles due to factors such as surface chemical heterogeneity and surface structural heterogeneity FIG. 14 presents data regarding these microscale interactions. In Part A, NOA170 is printed on the primary substrate as the $n_H$ material, and the $n_L$ materials are printed on top of a secondary support layer of NOA170 (unfilled markers in FIG. 14, Part A). NOA170 is printed on secondary support layers of $n_L$ photopolymers (filled markers in FIG. 4A). The low refractive index materials in these examples include: Loctite3526, NOA144, NOA142, NOA13825, NOA138, NOA13775, NOA1369, and NOA1348. Three regimes defined by the roughness of the formed film (e.g., 60 µm×60 µm) of a build material on a substrate are delineated for ease of characterization. A monotonically increasing linear relationship on a log-log plot is found between the contact angle of a single droplet (2-10 µm) of a build material on a substrate (primary substrate/secondary layer of a different material) and the roughness of a printed film of the same build material on the substrate. It is observed that build materials with a low contact angle have a higher likelihood of adhering to previous surfaces and forming a uniform thin-film on them. Focusing on the microscale measurements in Part A of FIG. 14, a printed layer of NOA170 serves as the secondary support layer for the deposition of low index materials. All low index inks exhibit fully merged thin-films (less than 200 nm) with low contact angles (less than 15°) and low RMS surface roughness (less than 10 nm). Interestingly, the deposition of NOA170 on top of low refractive index materials does not perform as smoothly. Depending on the material in the previous (supporting) layer, the contact angles range from 10° to 50° with resultant pattern roughness values ranging from less than 20 nm to greater than 200 nm. One example of a low index material that NOA170 fully merges onto is filtered Loctite3526, while NOA170 printed onto several other low index ink secondary support layers shows partial merging.

The results shown in Part A of FIG. 14 describe material spreading on a uniform surface with low roughness (e.g., less than 10 nm). At the microscale, in addition to the topology, chemical heterogeneity of the previous layer may play a role in surface roughness. The thickness of the current layer may be affected by the roughness of the previous layer.

The effects of process parameters may be combined with the foregoing results to achieve suitable material spreading of printed layers of polymers. For instance, the spreading may be a function of process parameters and the contact angle of printed single droplets. Additional or alternative liquid inks may be used, including, for instance, nanoparticle-based liquid inks. Alternative or additional material properties, such as density, viscosity, and conductivity, may also be used to control material spreading for a broad range of materials at the microscale.

Macroscale surface energetics were tested to further explore material spreading. While the disclosed methods may focus on controlling material behaviors at the microscale, measuring SSE at these length scales is quite difficult. Surface energetics at the macroscale may thus be useful. The results are summarized in Part B of FIG. 14. The silicon wafer showed the highest average SSE ($\gamma_s$=66.3 mN m$^{-1}$), followed by NOA170 ($\gamma_s$=48.3 mN m$^{-1}$), while the lower index materials ($n_L$=1.35-1.51) exhibited significantly lower SSE values ($\gamma_s$=11.5-19.5 mN m$^{-1}$). A material with a high SSE value may be a more favorable substrate for realizing uniform film formation of the next layer. This supports the observations that NOA170 is a favorable substrate for the examples of low index materials addressed herein.

The LST values of the example inks were evaluated using the pendant droplet method. An ink may be considered to be a highly cohesive ink if the ink has a high LST value and exhibits poor wetting behavior due to a preference for attaching to itself rather than adhering to a substrate. On the other hand, poorly cohesive inks (low LST values) are not able to remain bonded to themselves to form a uniform pattern on existing topographies. Based on the values provided in Part B of FIG. 11, NOA170 has a relatively high LST value (37.3 mN m$^{-1}$). Note that NOA170 spreads readily on a silicon substrate ($\gamma_{s\ (silicon)} > \gamma_{(NOA170)}$), but exhibits mixed merging behavior on lower SSE valued surfaces. A highly cohesive ink (e.g., NOA170) is unlikely to adhere to a low surface energy substrate, ($\gamma_{l\ (NOA170)} > \gamma_{s\ (nL\ materials)}$). In some cases, these interactions may be addressed as follows. First, the SSE value of a merged layer of an $n_L$ material may be increased using in-situ modifications such as atmospheric plasma treatments. Second, efforts may be spent in determining methods for decreasing the LST of a high index material (e.g., NOA170) to promote improved merging quality.

The material interactions at the microscale are a result of a trade-off between contact angle, SSE, and LST values. For example, printed droplets of NOA170 on NOA1348 and NOA138 secondary support layers exhibit similar contact angles at the microscale (Part A of FIG. 14). However, a lower SSE value for NOA1348 may address why NOA170 fails to result in a merged film on this surface. The filtered Loctite3526 and NOA13775 have similar SSE values; however, the higher contact angle of printed droplets of NOA170 on the printed NOA13775 surface results in a rougher surface deposition for films of NOA170. In addition, partial merging was observed with the deposition of NOA170 on NOA138, NOA142, and NOA144; which also showed moderate contact angles of printed NOA170 droplets (15°<θ<25°) as compared to NOA1369 with similar SSE values.

Figure 15:
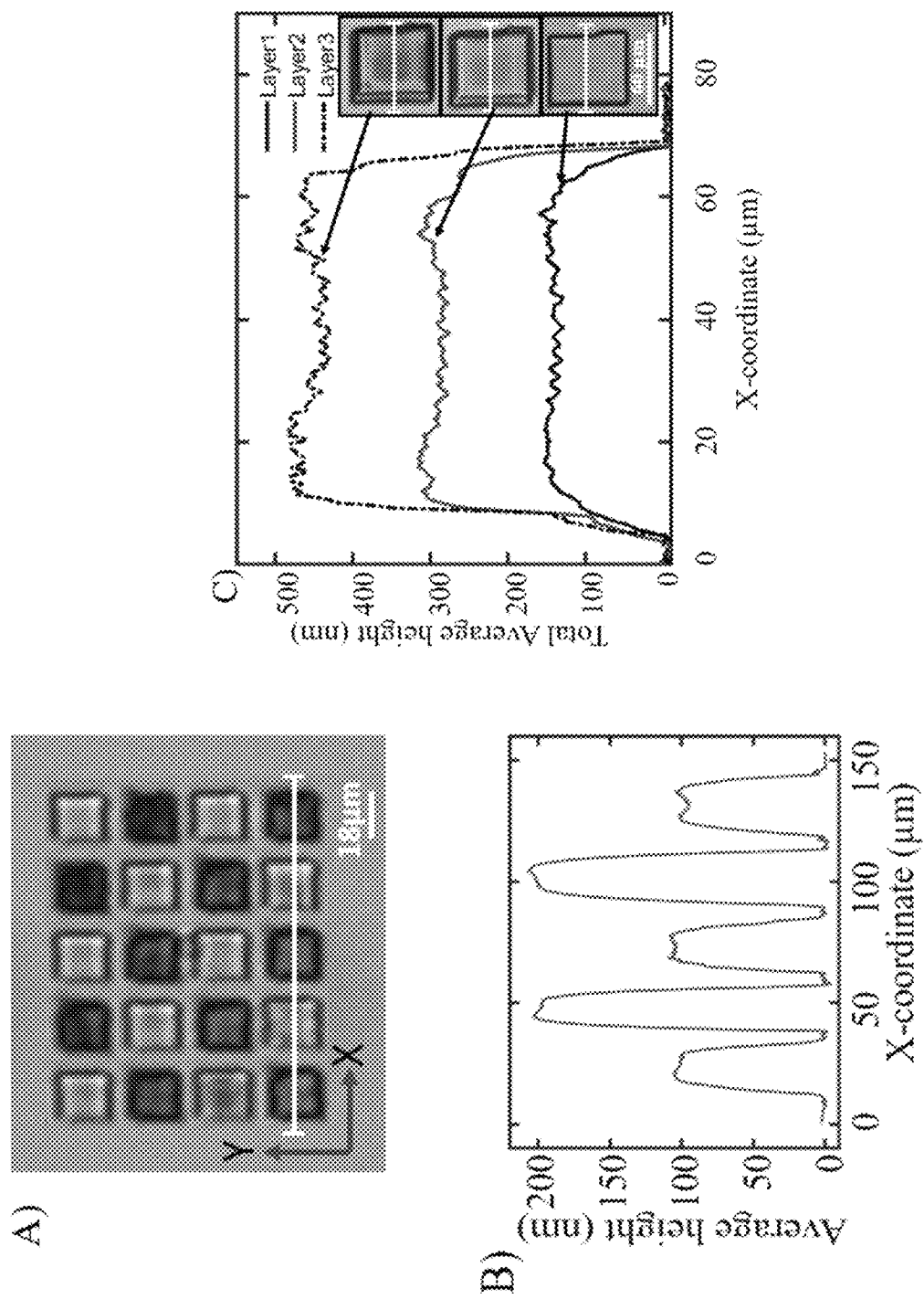
FIG. 15 depicts a photographic, plan view of a photonic device having an array of multi-layer photonic structures in accordance with one example, along with graphical plots of the thickness of the layers of the structures.
Figure 16:
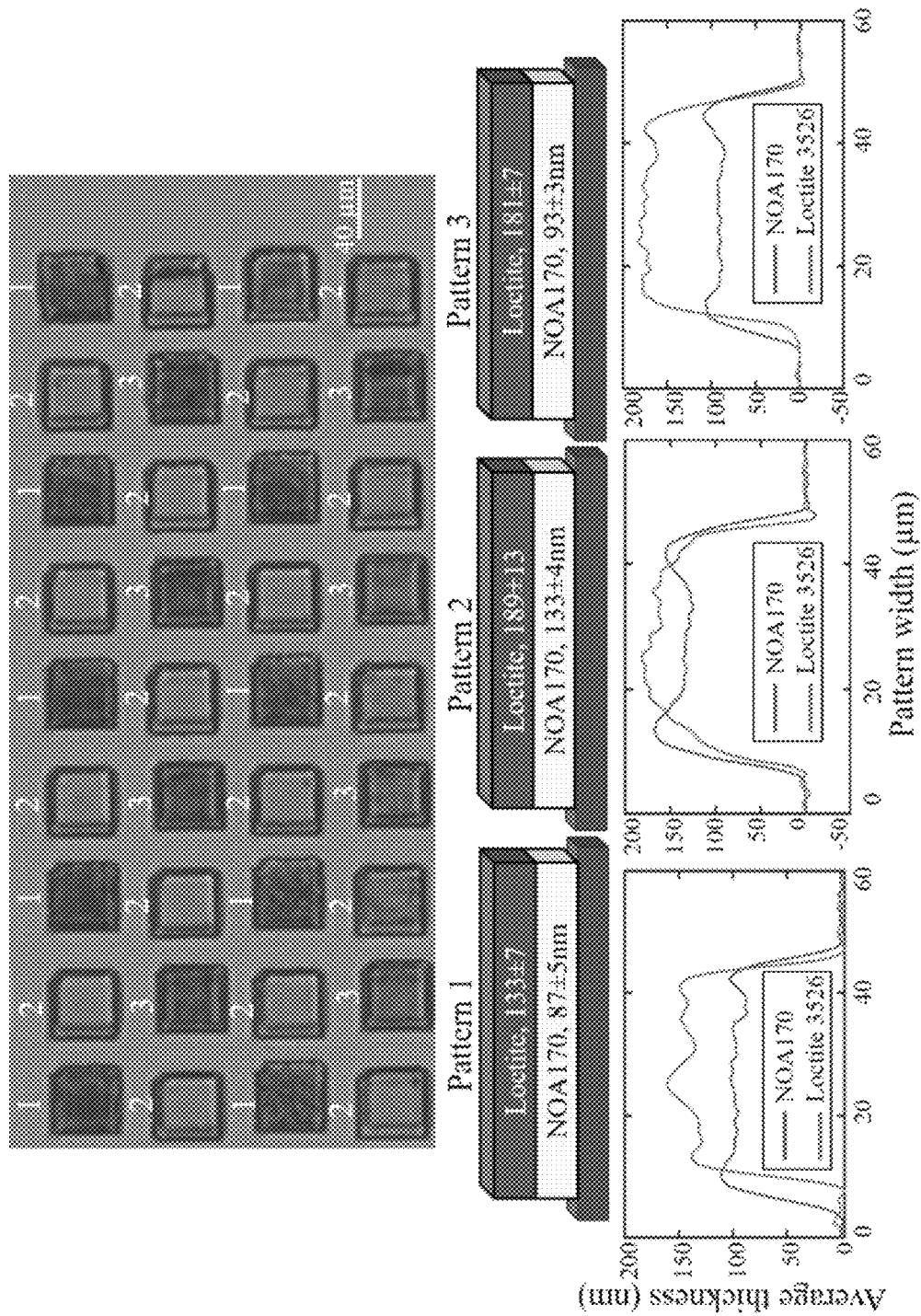
FIG. 16 depicts a photographic, plan view of an array of multi-layer photonic structures in accordance with one example, along with graphical plots of the thickness of the layers of the structures.

FIGS. 15 and 16 present the results of the fabrication of a number of examples of multi-layer thin-film structures. The structures may correspond with, or form a portion of, one or more of the photonic devices described herein.

Part A of FIG. 15 shows multi-material microstructures that were fabricated by e-jet printing of two high viscosity adhesives at room temperature in accordance with one example. In this case, the fabrication method was implemented and configured to deposit high-resolution NOA170 and NOA13825 patterns with layers of 100 nm and 200 nm average thickness, respectively. The darker color patterns were 20×20 µm films of NOA170 (4400-5000 cP) with an average thickness and RMS roughness of 101 nm and 5 nm, respectively. The lighter colors were deposited 17×17 µm films of NOA13825 (5600 cP) with an average thickness and RMS roughness of 205 nm and 12 nm, respectively. The distance between the patterns was set at 5 µm. The pattern profile across the last row of the printed structure (shown in Part B of FIG. 15) highlights the flexibility and repeatability of the e-jet printing process.

The multi-material, multi-layer fabrication of two high viscosity materials using e-jet printing is presented in Part C of FIG. 15. NOA170 was printed in layers 1 and 3, while filtered Loctite3526 was printed in layer 2. To achieve the desired effect, each layer is designed to be approximately 160 nm thick. The e-jet process parameters for NOA170 were $V_h$=600 V, $V_f$=200 V, $t_p$=1 ms, f=20 Hz, and pitch=1.8 µm. The e-jet process parameters for Loctite3526 were $V_h$=500 V, $V_f1$=250 V, $t_p$=5 ms, f=20 Hz, and pitch=2 µm. At each layer, the liquid patterns were UV-cured and their topography was measured using the integrated AFM.

Part C of FIG. 15 shows the corresponding average total height map over five pixels from the middle of the pattern at each layer. The overall variation (roughness/total height) in the total stack height was less than 6% across a single layer and 4% across the entire stack. The average total height is 159±9 nm for layer 1, 325±13 nm for layer 2, and 489±17 nm for layer 3, respectively. The maximum RMS roughness in all layers is less than 17 nm, which is a demonstration of the flatness in the overall height. The integration of control to the e-jet process may be used to mitigate height variations.

FIG. 16 depicts an example of a high-resolution e-jet printed Bayer filter array using a high refractive index polymer (NOA170, n=1.7) and a medium refractive index material (Loctite3526, n=1.51). Patterns 1, 2, and 3 are associated with the red, blue, and green color spectrum, respectively, and are equally spaced with a 15 µm offset with roughness smaller than 13 nm. As shown via these bi-layer samples, the e-jet process may independently control layer thickness, regardless of the previous printed layer thickness, with the end result being control over the reflected light intensity at specific areas of the spectrum. Thus, the following layer goals were set with the first and second layers at 90 nm and 130 nm for pattern 1, 130 nm and 180 nm for pattern 2, and 90 nm and 180 nm for pattern 3, respectively. These combinations achieved red, green, and blue reflected peak intensity with differing combinations of thickness of both the NOA170 as base layer and Loctite3526 as the second layer. Through drop-on-demand e-jet printing, the thickness of each layer is controlled precisely and by design. As demonstrated, it is possible to create a variable color spectrum using e-jet printing, as the color spectrum is correlated with the layer thickness and the corresponding refractive indices of each layer. Therefore, for a fixed material combination, the optical properties may be varied by adjusting the layer thickness.

The above-described examples show that the thickness variation is within 6% across a single layer. Different factors may affect these variations, including, for instance, (1) the measurement apparatus has ±10 nm thermal noise that directly affects the roughness measured, (2) commercial inks may contain large particles that increase thickness variations, and (3) the e-jet is an iteration varying process and different factors such as nozzle clogging, environment temperature and humidity, and more can affect the deposition process and eventually affect the roughness.

Figure 17:
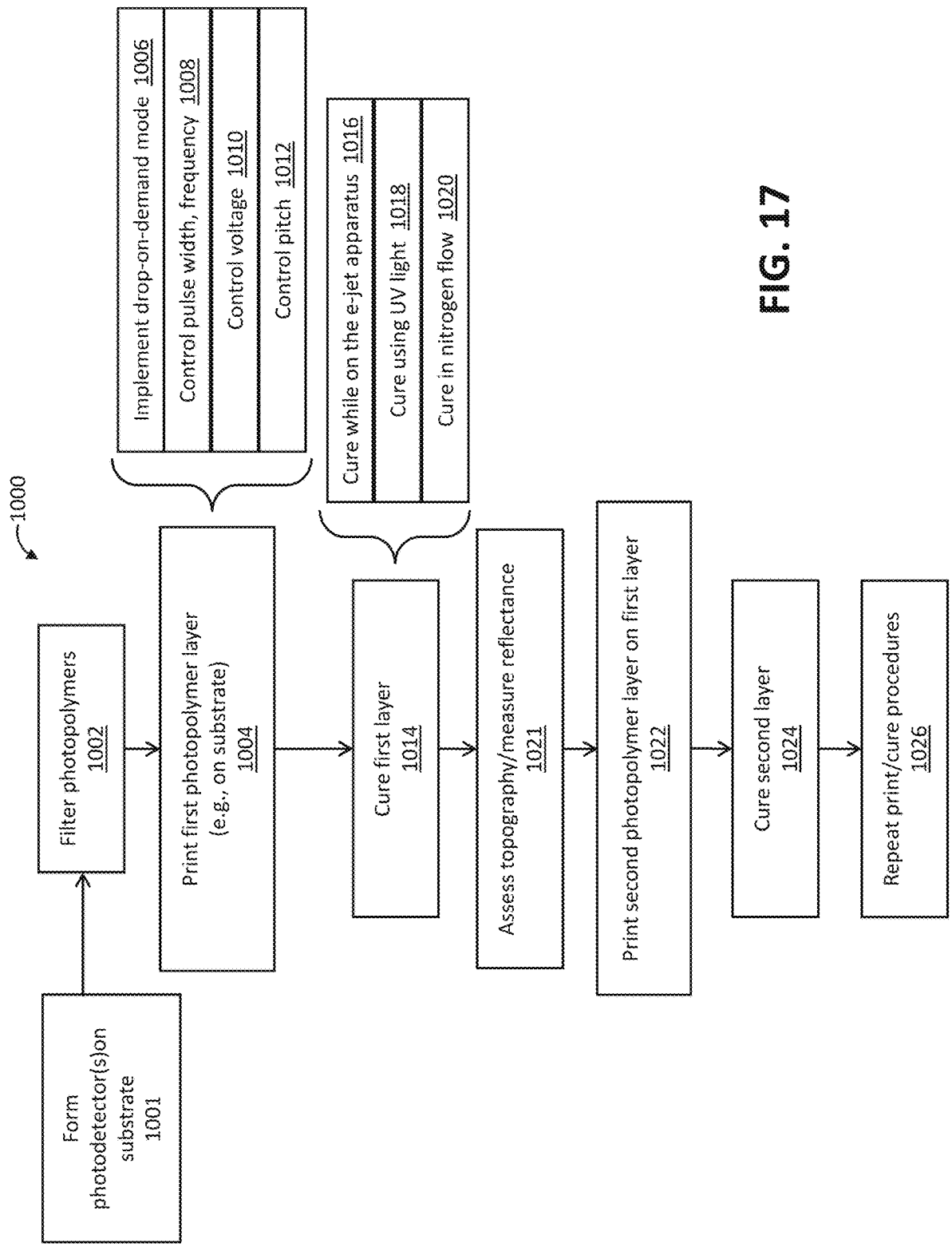
FIG. 17 is a flow diagram of a method of fabricating a photonic structure and/or device using electrohydrodynamic jet printing in accordance with one example.

FIG. 17 depicts a method 1000 of fabricating a photonic device in accordance with one example. The method 1000 may include fewer, additional, or alternative acts. For example, the method 1000 may include any number of printing and curing acts. The method 1000 may also include one or more acts directed to forming a photodetector or other device on the substrate. An ink filtering act may or may not be implemented.

In the example of FIG. 1, the method 1000 may begin with an act 1001 in which one or more detectors are formed on a substrate. In some cases, the substrate is composed of, or otherwise includes, silicon. The composition and/or other characteristics may vary. For instance, the substrate may be composed of, or otherwise include, glass, indium tin oxide (ITO) coated glass, and/or other materials.

The act 1001 may include forming a photodetector on the substrate such that a first layer of the stack is supported by the photodetector. The act 1001 may alternatively or additionally be directed to otherwise preparing the substrate and/or other structures on which the photopolymer stacks are disposed.

In some cases, one or more photopolymer materials are filtered in an act 1002. For instance, a first photopolymer may be filtered in preparation for printing a first layer. The act 1002 may include alternative or additional photopolymer preparation steps.

In an act 1004, a first layer composed of, or otherwise including, a first photopolymer is printed such that the first layer is supported indirectly or directly by the substrate, as described herein. The printing uses an electrohydrodynamic jet (e-jet) printing apparatus, as described herein. In some cases, the e-jet printing apparatus is operated in a drop-on-demand mode in an act 1006. The act 1004 may include an act 1006 in which a pulse width and/or frequency of the e-jet printing apparatus is controlled. The act 1004 may include controlling a voltage of the e-jet printing apparatus in an act 1010 and/or a pitch of droplets deposited by the e-jet printing apparatus in an act 1012.

In an act 1014, the first layer is cured. In some cases, the first layer is cured in an act 1016 while on the e-jet printing apparatus. The act 1014 may include an act 1018 in which the first layer is cured using UV light. Alternatively or additionally, the first layer may be cured in a nitrogen flow in an act 1020.

In some cases, the method 1000 includes an act 1021 in which the reflectance of the first layer is measured before printing a second layer. In some cases, the measurement is implemented using a microspectrometer integrated with the e-jet printing apparatus.

In an act 1022, a second layer is printed using the e-jet printing apparatus such that the second layer is supported by the first layer. The second layer is composed of, or otherwise includes, a second photopolymer, as described herein. The act 1022 may include any one or more of the printing steps or procedures described herein, e.g., such as in connection with printing the first layer.

The second layer is cured in an act 1024. Curing the second layer may include any one or more of the curing steps or procedures described herein, e.g., such as in connection with curing the first layer. In some cases, curing of the first layer and/or curing of the second layer are implemented while the substrate remains on the e-jet printing apparatus.

The method 1000 may then include an act 1026 in which the above-described printing and curing acts are repeated. For instance, the acts may be repeated to print one or more pairs of layers including the first and second photopolymers such that the one or more pairs of layers are supported by the second layer.

The order of the acts may vary from the example shown. For example, the filtering of the photopolymers may be implemented sequentially, e.g., after the previous layer has been deposited and/or cured. In another example, further printing of a first layer (act 1004) may be implemented after the topography of the device is assessed (and/or reflectance is measured) using an inline or integrated microspectrometer (act 1021) before proceeding with the printing of a second layer. Any number of reflectance measurements using the microspectrometer may be implemented during the procedure due to the integrated nature of the microspectrometer.

Figure 18:
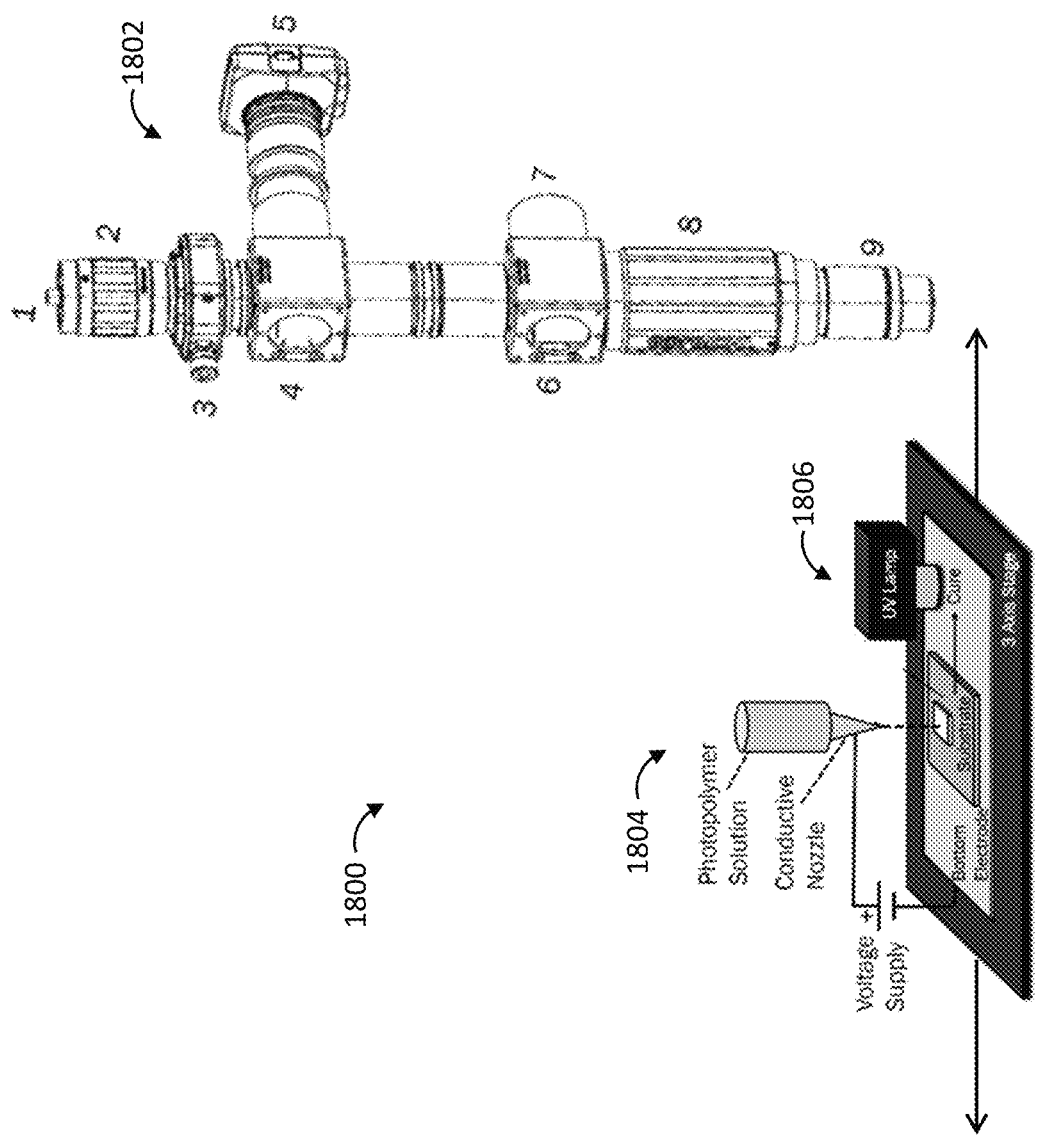
FIG. 18 is a schematic diagram of an e-jet printing system having respective, inline (or otherwise integrated) stations for e-jet printing, curing, and microspectroscopy in accordance with one example.

FIG. 18 depicts of an e-jet printing system 1800 in accordance with one example. In this case, the e-jet printing system 1800 includes an inline or integrated microspectrometer 1802. The e-jet printing system 1800 may be used to implement the method of FIG. 17. The e-jet printing system 1800 includes an e-jet printing apparatus 1804, a curing apparatus 1806, and the microspectrometer 1802, each being disposed at a respective station. In operation, the substrate on which the photonic device is being fabricated may be shuttled (depicted via arrows) between the stations to implement the method.

In the example of FIG. 18, the microspectrometer 1802 includes a fiber optic cable 1, a fiber zoom housing 2 for focusing spot size, an XY stage 3 for fiber sample spot adjustment (e.g., for microscale precision), a beamsplitter 4 for image acquisition (e.g., a 90/10 (R:T) visible beamsplitter), a CMOS camera 5, which may be monochromatic or color, variable R:T beamsplitters 6 (e.g., UV, visible, NIR, MIR), variable light source 7 (e.g., halogen, fluorescent, visible, IR, etc.), which may include a laser source or an interferometer for Raman FTIR measurements, an objective zoom housing 8 for focusing objective, a variable microscope objective 9 with refractive and reflective options, and one or more variable spectrometers with various wavelength detection ranges (e.g., 300-850 nm, 900-1600 nm, etc.).

In operation, inline or integrated microspectroscopy is provided by passing light from the light source 7 to the beam splitter 6. The split beam is then focused by the objective zoom onto the sample surface and then used to collect the reflected light. The reflected light passes back through the beam splitter 6 and then onto the beamsplitter 4. A portion (e.g., 10%) of the light is sent to the camera 5, while the remainder is set to the spectrometer for processing.

The integration of the microspectrometer 1802 permits in situ measurement of optical properties (e.g., reflectance) of the patterns being printed, and thereby enables rapid iteration of the structure and printing parameters to achieve a desired outcome.

Various photopolymer materials may be used. In one example, the materials include one or more optical adhesives, such as adhesives available from Norland Optical Products (NOA) as well as a commercial Loctite formulation.

The e-jet printing apparatus 1804 may be configured for high-resolution patterning. For instance, nozzles smaller than 1 μm in inner diameter may be used with a 20 μm standoff height.

The method may include one or more filtering acts. Some inks contain large particles (e.g., comprising resin, a long chain oligomer, or foreign moieties). Such particles may be removed via filtering in order to reduce the chance of nozzle clogging. For example, Loctite3526 may be filtered using high pressure and a filter with 0.22 μm diameter pores. The removal of large particles may also reduce the surface roughness of the printed patterns.

Filtering may, in some cases, change other ink properties. For example, filtered NOA170 has a smaller refractive index value than unfiltered NOA170, while also exhibiting an unstable spray jet instead of a single stable jet mode at the same standoff height and voltage.

The printing acts may be implemented in an ambient atmosphere. The curing acts may be implemented in a nitrogen atmosphere due to oxygen inhibition of the photopolymerization of one or more of the inks (excluding Loctite 3526). This may be achieved by creating an enclosure around the LED curing bulb and flowing nitrogen at a high rate over the surface.

Described above are e-jet printing-based methods of fabrication that utilize the merging quality of UV-curable polymers to form thin-film, multi-material, layered microstructures. Materials and process criteria may be selected to achieve material ejection as well as material merging in the e-jet printing. The e-jet printing-based methods may serve as a substitute for other manufacturing techniques, such as lithography, to fabricate high-resolution photonic devices that are made of multiple thin layers of different materials. Microscale, high-quality films were fabricated with the following material combinations (1) low contact angle, (2) high surface tension of the build material, and (3) high surface energy of the previous layer. The controllability and repeatability of e-jet printing were demonstrated by fabricating a Bayer filter of multiple colors using a drop-on-demand printing mode of the e-jet printing.

Novel structures (e.g., photonic and electronic structures) with useful thermal, electrical, and optical properties may be fabricated by the e-jet printing-based methods. The structures may include multi-material, multi-layer films with microscale spatial resolution and nanoscale thickness control. The structures may be configured to form one dimensional photonic crystals (1DPCs) with a response near, e.g., the visible regime. Photopolymers with varying refractive indices (n=1.35 to 1.70) may be used based on their relative high index contrast and fast curing times. The structures may be combined to provide pixelated 1DPCs with individual layer thicknesses between 80-200 nm, square pixels smaller than 40 μm across, with surface roughness less than 20 nm.

The present disclosure has been described with reference to specific examples that are intended to be illustrative only and not to be limiting of the disclosure. Changes, additions and/or deletions may be made to the examples without departing from the spirit and scope of the disclosure.

The foregoing description is given for clearness of understanding only, and no unnecessary limitations should be understood therefrom.

What is claimed is:

1. A device comprising:
   a substrate; and
   a patterned stack supported by the substrate, wherein the patterned stack comprises:
      a first layer supported by the substrate, the first layer comprising a first photopolymer; and
      a second layer supported by the first layer, the second layer comprising a second photopolymer;
   wherein the first and second photopolymers have different refractive indices.

2. The device of claim 1, wherein the patterned stack further comprises further alternating patterned layers of the first and second photopolymers, the alternating patterned layers being supported by the second patterned layer.

3. The device of claim 1, wherein each of the first and second patterned layers has a thickness less than about 200 nm.

4. The device of claim 1, wherein the patterned stack is configured as a one-dimensional photonic crystal.

5. The device of claim 1, wherein the patterned stack is configured as a Bragg reflector.

6. The device of claim 1, wherein the patterned stack is one of a pixelated array of patterned stacks supported by the substrate.

7. The device of claim 1, further comprising a photodetector supported by the substrate.

8. The device of claim 7, wherein the photodetector is disposed between the patterned stack and the substrate.

9. The device of claim 1, wherein the substrate comprises silicon.

10. The device of claim 1, wherein the first photopolymer has a higher refractive index than the second photopolymer.

11. The device of claim 1, wherein the patterned stack further comprises a third layer supported by the second layer, the third layer comprising a third photopolymer.

* * * * *